United States Patent
Gu

(10) Patent No.: US 10,261,760 B1
(45) Date of Patent: Apr. 16, 2019

(54) SYSTEMS AND METHODS FOR TRACING PERFORMANCE INFORMATION FROM HARDWARE REALIZATIONS TO MODELS

(71) Applicant: The Mathworks, Inc., Natick, MA (US)

(72) Inventor: Yongfeng Gu, Brookline, MA (US)

(73) Assignee: The MathWorks, Inc., Natick, MA (US)

( * ) Notice: Subject to any disclaimer, the term of this patent is extended or adjusted under 35 U.S.C. 154(b) by 0 days.

(21) Appl. No.: 14/562,356

(22) Filed: Dec. 5, 2014

Related U.S. Application Data

(60) Provisional application No. 61/912,200, filed on Dec. 5, 2013.

(51) Int. Cl.
*G06F 8/35* (2018.01)

(52) U.S. Cl.
CPC ..................................... *G06F 8/35* (2013.01)

(58) Field of Classification Search
USPC ....................................................... 717/105
See application file for complete search history.

(56) References Cited

U.S. PATENT DOCUMENTS

| | | |
|---|---|---|
| 5,164,724 A | 11/1992 | Hartley et al. |
| 5,426,591 A | 6/1995 | Ginetti |
| 5,544,067 A | 8/1996 | Rostoker |
| 5,553,002 A | 9/1996 | Dangelo |
| 5,555,201 A | 9/1996 | Dangelo et al. |
| 5,586,325 A | 12/1996 | MacDonald et al. |
| 5,655,109 A | 8/1997 | Hamid |
| 5,701,294 A | 12/1997 | Ward et al. |

(Continued)

FOREIGN PATENT DOCUMENTS

| | | |
|---|---|---|
| EP | 1387260 A1 | 2/2004 |
| JP | 2008140061 A | 6/2008 |

OTHER PUBLICATIONS

"Synthesis and Simulation Design Guide", Xilinx, 2008, pp. 1-218.

(Continued)

*Primary Examiner* — Li B. Zhen
*Assistant Examiner* — Bradford F Wheaton
(74) *Attorney, Agent, or Firm* — Cesari and McKenna, LLP; Michael R. Reinemann

(57) ABSTRACT

Systems and methods trace performance data generated by a hardware synthesis tool chain to model elements of a model. During code generation, an initial in-memory representation is generated for the model. The in-memory representation includes a plurality of nodes that correspond to the model elements. The in-memory representation is subjected to transformations and optimizations creating transitional in-memory representations and a final in-memory representation from which HDL code is generated. A graph builder constructs a genealogy graph that traces the transformations and optimizations. The genealogy graph includes graph objects corresponding to the nodes of the in-memory representations. The synthesis tool chain utilizes the HDL code to perform hardware synthesis. The synthesis tool chain also generates performance data. Utilizing the genealogy graph, the performance data is mapped to the nodes of the initial in-memory representation, and to the elements of the model.

23 Claims, 15 Drawing Sheets

(56) References Cited

U.S. PATENT DOCUMENTS

| | | | |
|---|---|---|---|
| 5,726,902 | A | 3/1998 | Mahmood |
| 5,764,525 | A | 6/1998 | Mahmood |
| 5,764,951 | A | 6/1998 | Ly et al. |
| 5,920,711 | A | 7/1999 | Seawright et al. |
| 5,923,653 | A | 7/1999 | Denton |
| 5,956,674 | A | 9/1999 | Smyth et al. |
| 6,118,902 | A | 9/2000 | Knowles |
| 6,128,025 | A | 10/2000 | Bright et al. |
| 6,173,438 | B1 | 1/2001 | Kodosky et al. |
| 6,216,252 | B1 | 4/2001 | Dangelo et al. |
| 6,282,699 | B1 | 8/2001 | Zhang et al. |
| 6,363,515 | B1 | 3/2002 | Rajgopal |
| 6,363,520 | B1 | 3/2002 | Boubezari |
| 6,389,579 | B1 | 5/2002 | Phillips |
| 6,397,170 | B1 | 5/2002 | Dean |
| 6,437,805 | B1 | 8/2002 | Sojoodi et al. |
| 6,505,339 | B1 | 1/2003 | Miller et al. |
| 6,526,562 | B1 | 2/2003 | Haddad |
| 6,584,601 | B1 | 6/2003 | Kodosky et al. |
| 6,651,222 | B2 | 11/2003 | Gupta et al. |
| 6,654,945 | B1 | 11/2003 | Nakayama |
| 6,813,597 | B1 | 11/2004 | Demler |
| 6,883,147 | B1 | 4/2005 | Ballagh et al. |
| 7,007,254 | B1 | 2/2006 | Borkovic |
| 7,076,415 | B1 | 7/2006 | Demler |
| 7,103,526 | B2 | 9/2006 | Allen et al. |
| 7,143,368 | B1 | 11/2006 | Plofsky et al. |
| 7,162,710 | B1 | 1/2007 | Edwards et al. |
| 7,178,112 | B1 | 2/2007 | Ciolfi et al. |
| 7,197,743 | B2 | 3/2007 | Borg et al. |
| 7,260,501 | B2 | 8/2007 | Pattloati et al. |
| 7,272,542 | B1 | 9/2007 | Sanders |
| 7,275,026 | B2 | 9/2007 | Mani et al. |
| 7,313,449 | B1 | 12/2007 | Ciolfi et al. |
| 7,318,014 | B1 | 1/2008 | Molson et al. |
| 7,331,037 | B2 | 2/2008 | Dickey et al. |
| 7,340,684 | B2 | 3/2008 | Ramamoorthy et al. |
| 7,366,997 | B1 | 4/2008 | Rahmat et al. |
| 7,376,544 | B1 | 5/2008 | Dick et al. |
| 7,503,027 | B1 | 3/2009 | Zhao |
| 7,509,244 | B1 | 3/2009 | Shakeri et al. |
| 7,530,047 | B2 | 5/2009 | Wang |
| 7,725,848 | B2 | 5/2010 | Nebel |
| 7,788,625 | B1 | 8/2010 | Donlin et al. |
| 7,882,457 | B1 | 2/2011 | Plofsky et al. |
| 7,882,462 | B2 | 2/2011 | Ogilvie |
| 7,900,188 | B2 | 3/2011 | Costa et al. |
| 7,983,879 | B1 | 7/2011 | Vetsch et al. |
| 8,041,551 | B1 | 10/2011 | Pakyari |
| 8,046,386 | B2 | 10/2011 | Taitel |
| 8,082,530 | B1 | 12/2011 | Ou et al. |
| 8,095,899 | B1 | 1/2012 | Dupenloup |
| 8,201,121 | B1 | 6/2012 | Sankaralingam |
| 8,286,112 | B2 | 10/2012 | Miranda et al. |
| 8,359,586 | B1* | 1/2013 | Orofino et al. ............... 717/152 |
| 8,402,449 | B1 | 3/2013 | Biswas |
| 8,458,630 | B1 | 6/2013 | Van Canpenhout |
| 8,533,642 | B1 | 9/2013 | Ogilvie |
| 8,533,742 | B2* | 9/2013 | Ginis ................. G06F 9/542 |
| | | | 719/315 |
| 8,589,870 | B2 | 11/2013 | Ogilvie |
| 8,694,947 | B1 | 4/2014 | Venkataramani |
| 8,745,558 | B1 | 6/2014 | Garofalo |
| 8,806,403 | B1 | 8/2014 | Denisenko |
| 8,863,069 | B1 | 10/2014 | Venkataramani et al. |
| 8,869,103 | B2* | 10/2014 | Conrad et al. ............... 717/106 |
| 8,898,049 | B2 | 11/2014 | Dhanwada et al. |
| 8,904,367 | B1 | 12/2014 | Biswas |
| 9,298,862 | B1 | 3/2016 | Venkataramani |
| 9,300,275 | B1 | 3/2016 | Kumar |
| 9,449,132 | B2 | 9/2016 | Chen et al. |
| 2002/0022905 | A1 | 2/2002 | Erlanoen et al. |
| 2002/0080174 | A1 | 6/2002 | Kodosky et al. |
| 2002/0188928 | A1 | 12/2002 | Szpak et al. |
| 2002/0193078 | A1 | 12/2002 | MacFarlane Shearer et al. |
| 2003/0016234 | A1 | 1/2003 | Mani et al. |
| 2003/0215017 | A1 | 11/2003 | Fang |
| 2004/0049596 | A1 | 3/2004 | Schuehler et al. |
| 2004/0088674 | A1 | 5/2004 | Kato |
| 2004/0210685 | A1 | 10/2004 | Orofino et al. |
| 2004/0243964 | A1 | 12/2004 | McElvain |
| 2005/0055666 | A1 | 3/2005 | Kornerup et al. |
| 2005/0204316 | A1 | 9/2005 | Nebel |
| 2006/0057594 | A1 | 3/2006 | Wang |
| 2006/0064670 | A1 | 3/2006 | Linebarger et al. |
| 2006/0080076 | A1 | 4/2006 | Lahiri et al. |
| 2006/0095871 | A1 | 5/2006 | Levy |
| 2006/0190851 | A1 | 8/2006 | Karaki |
| 2006/0225021 | A1 | 10/2006 | Padalia et al. |
| 2006/0294491 | A1 | 12/2006 | Becker |
| 2007/0058572 | A1 | 3/2007 | Clauberg |
| 2007/0083831 | A1 | 4/2007 | Hamilton |
| 2007/0113209 | A1 | 5/2007 | Park et al. |
| 2007/0261040 | A1 | 11/2007 | Ogilvie et al. |
| 2007/0277161 | A1 | 11/2007 | Herbordt et al. |
| 2008/0066046 | A1 | 3/2008 | Ogilvie |
| 2008/0098349 | A1 | 4/2008 | Lin et al. |
| 2008/0189089 | A1 | 8/2008 | Lee |
| 2008/0234995 | A1 | 9/2008 | Newcomb et al. |
| 2009/0002371 | A1 | 1/2009 | Linebarger et al. |
| 2009/0031278 | A1 | 1/2009 | McElvain |
| 2009/0144673 | A1 | 6/2009 | Goodnow |
| 2009/0150857 | A1 | 6/2009 | Srinivasan |
| 2009/0183127 | A1* | 7/2009 | Bell et al. ................. 716/4 |
| 2009/0254525 | A1 | 10/2009 | Srinivasan |
| 2010/0050135 | A1 | 2/2010 | Aleksanyan |
| 2010/0058272 | A1 | 3/2010 | Bowers |
| 2010/0131934 | A1 | 5/2010 | Kim |
| 2010/0241620 | A1* | 9/2010 | Manister ........... G06F 17/30616 |
| | | | 707/709 |
| 2011/0035203 | A1 | 2/2011 | Dalton et al. |
| 2011/0041106 | A1 | 2/2011 | Li |
| 2012/0030646 | A1 | 2/2012 | Ravindran |
| 2012/0072876 | A1 | 3/2012 | Salz |
| 2012/0124552 | A1 | 5/2012 | Lin et al. |
| 2012/0274357 | A1 | 11/2012 | Klass |
| 2013/0139119 | A1* | 5/2013 | Hidvegi et al. ............... 716/111 |
| 2013/0147547 | A1 | 6/2013 | Nalawade |
| 2013/0212365 | A1 | 8/2013 | Chen |
| 2013/0212366 | A1 | 8/2013 | Chen |
| 2014/0157218 | A1 | 6/2014 | Gu |
| 2015/0178418 | A1 | 6/2015 | Gu |

OTHER PUBLICATIONS

"Synthesis and Simulation Design Guide", Xilinx, Mar. 1, 2011, pp. 1-178.

"Simulink HDL Coder™: User's Guide", The MathWorks, Inc., Sep. 2012, pp. 1-1305 (uploaded in 6 parts).

Fernandez, Michelle, "How to Maximize FPGA Performance," EE Times, Designlines Programmable Logic, UBM Electronics, Jan. 15, 2007, pp. 1-5.

Thatte, Sanjay, "FPGA Synthesis Can Be a Leverage Point in Your Design Flow," EE Times, Designlines Programmable Logic, UBM Electronics, Dec. 2, 2009, pp. 1-5.

Venkataramani, Girish, et al., "Global Critical Path: A Tool for System-Level Timing Analysis," ACM, DAC 2007, San Diego, CA, Jun. 4-8, 2007, pp. 1-4.

Zhang, Jiyu, et al., "Bit-Level Transformation and Optimization for Hardware Synthesis of Algorithmic Descriptions," Aug. 2009, pp. 1-8.

Zhong, Lin, et al., "Power Estimation for Cycle-Accurate Functional Descriptions of Hardware," Nov. 2004, pp. 1-8.

Acosta, Alfonso, "ForSyDe: Rising the Abstraction Level in System Design," Royal Institute of Technology, Stockholm, Sweden, Mar. 27, 2008, pp. 1-98.

"Actel Digital Signal Processing (DSP) Solution," Actel Corporation, <http://web.archive.org/web/20071028055746/www.actel.com/products/solutions/dsp/default.aspx>, Oct. 11, 2007, pp. 1-5.

Ahuja, Sumit, "High Level Power Estimation and Reduction Techniques for Power Aware Hardware Design," Virginia Polytechnic Institute and State University, Blacksburg, Virginia, May 12, 2010, pp. ii-43.

(56) References Cited

OTHER PUBLICATIONS

Akella, Sreesa, "Guidelines for Design Synthesis Using Synopsys Design Compiler," Department of Computer Science Engineering University of South Carolina, Columbia, South Carolina, Dec. 2000, pp. 1-13.
Allen, Eric et al., "Interactive Object-Oriented Simulation of Interconnected Power Systems Using Simulink," IEEE Transactions Education, vol. 44(1):87-95, Feb. 2001.
Banerjee, Prithviraj et al., "Overview of a Compiler for Synthesizing MATLAB Programs onto FPGAs," IEEE Transactions on Very Large Scale Integration (VLSI) Systems, vol. 12(3):312-324, Mar. 2004.
Bell, et al. "Integration of Hardware into the Labview Environment for Rapid Prototyping and the Development of Control Design Applications", Sep. 8, 2004, IEEE, pp. 79-81.
Benini, et al., Regression Models for Behavioral Power Estimation, Apr. 1998, Integrated Computer-Aided Eng., vol. 5, No. 2, pp. 95-106.
Bjureus, Per et al., "FPGA Resource and Timing Estimation from Matlab Execution Traces," International Conference on Hardware Software Codesign, Proceedings of the tenth international symposium on Hardware/software codesiqn, pp. 31-36, May 2002.
Chen, Deming, et al., "High-Level Power Estimation and Low-Power Design Space Exploration for FPGAs," IEEE, Jan. 2007, pp. 529-534.
Cordy, James R. et al, "GVL: A Graphical, Functional Language for the Specification of Output in Programming Languages," IEEE International Conference on Systems, Man and Cybernetics, pp. 11-22, Mar. 1990.
Dasgupta, Aurobindo, et al., "Simultaneous Scheduling Binding for Power Minimization During Microarchitecture Synthesis," Department of Electrical and Computer Engineering, University of Massachusetts-Amherst, Jan. 1995, pp. 1-6.
Goering, Richard, "MathWorks Moving Deeper into IC Design," Sep. 18, 2006, pp. 1-3.
Golin, Eric J., et al., "A Visual Design Environment," Proceedings of the 1993 IEEE/ACM international conference on Computer-aided design, Santa Clara, CA, pp. 364-367, Nov. 1993.
Haldar, Malay et al., "FPGA Hardware Synthesis from MATLAB," Fourteenth International Conference on VLSI Design, pp. 299-304 (Jan. 2001).
Hunt, Neil, "IDF: A graphical data flow programming language for image processing and computer vision," IEEE International Conference on Systems, Man and Cybernetics, pp. 351-360, Nov. 1990.
International Preliminary Report on Patentability for Application No. PCT/US2005/033846, dated Nov. 3, 2006.
International Search Report for Application No. PCT/US2006/036420, dated Jul. 2, 2007.
International Search Report for Application No. PCT/US2007/019734, dated Nov. 11, 2008.
Khouri, et al., "Fast High-level Power Estimation for Control-flow Intensive Designs", 1998, International Symposium on Low Power Electronics and Design Proceedings, pp. 299-304.
Khouri, K.S.; Lakshminarayana, G.; Jha, N.K. "High-level Synthesis of Low-power Control-flow Intensive Circuits", Dec. 1999, IEEE Transactions on CAD of Integrated Circuits and Systems, vol. 18, Issue: 12, pp. 1715-1729.
Khouri, et al., IMPACT: A High-Level Synthesis System for Low Power Control-flow Intensive Circuits, Feb. 23-26, 1998, Proceedings Design, Automation and Test in Europe, pp. 848-854.
Lakshminarayana, G.; Raghunathan, A.; Khouri, K.S.; Jha, N.K.; Dey, S., "Common-case Computation: A High-level Energy and Performance Optimization Technique", Jan. 2004, IEEE Transactions on CAD of Integrated Circuits and Systems, vol. 23, Issue: 1, pp. 33-49.
Leping, et al. "A Simulated Training System of Power Based on Interaction between C# Programs and Simulink", Mar. 2011, IEEE, p. 1-4.
Licko, Miroslav, et al., "MATLAB/Simulink Based Methodology for Rapid-FPGA-Prototyping," P.Y.K. Cheung et al., (Eds.), Lecture Notes on Computer Science, Field-Programmable Logic and Applications, Springer-Verlag, pas. 984-987, Jan. 2003.
Macii, Enrico, et al., "High-Level Power Modeling, Estimation, and Optimization," IEEE, vol. 17, No. 11, Nov. 1998, pp. 1061-1079.
Martins, Sergio et al., "A high-level tool for the design of custom image processing systems," Proceedings of the 2005 8th Euromicro conference on Digital System Design (OSO'05), pp. 346-349 (Sep. 2005).
"MathWorks™ Products for Signal Processing and Communications," The MathWorks, Inc., Mar. 2008, pp. 1-4.
MathWorks, "Stateflow and Statefiow coder, for Complex Logic and State Diagram Modeling, User's Guide, Version 5 " The MathWorks, Inc., Jul. 2002.
National Instruments, "LabVIEW User Manual", Apr. 2003, 349 pages.
Nayak, Anshuman et al., "Accurate Area and Delay Estimators for FPGAs," Proceedings of the 2002 Design, Automation and Test in Europe Conference and Exhibition (DATE'02), pp. 862-869, Mar. 2002.
Nebel, "System-level Power Optimization", Digital System Design, 2004, DSD 2004, Euromicro Symposium on, on pp. 27-34.
Ou, Jingzhao et al., "PyGen: A MATLAB/Simulink Based Tool for Synthesizing Parameterized and Energy Efficient Designs Using FPGAs," Proceedings of the 12th Annual IEEE Symposium on Field-Programmable Custom Computing Machines, pp. 47-56 (Apr. 2004).
"Precision RTL Synthesis User's Manual," 2003c Update 1, Mentor Graphics Corporation, Mar. 2004, pp. 1-119.
Pohl, Zdenek et al., "Logarithmic Arithmetic for Real Data Types and Support for Matlab/Sirnulink Based Rapid-FPGA-Prototyping," International Parallel and Distributed Processing Symposium, Apr. 2003.
Popinchalk, Seth, "Building Accurate, Realistic Simulink Models," Newsletters, The MathWorks, Inc., Nov. 2006, pp. 1-10.
Popinchalk, Seth, "Improving Simulation Performance in Simulink," The MathWorks, Inc., <http://www.eetimes.com/General/PrintView/4087424>, Apr. 2012, pp. 1-10.
Portero, Antoni et al., "Study of High Level design methodologies for a MPEG frames I Compressor for a HW/SW Implementation," 2004 IEEE International Conference on Industrial Technology (ICIT), DOS. 1688-1693 (Dec. 2004).
Radiolab 3G, "The Easier Way to 3G Design Success" RadioScape Ltd. (2003).
Radioscape, "Simulation Drive Testing in Wireless Communications Systems," RadioScape Ltd. (2003).
Raudvere, Tarvo, et al., "Application and Verification of Local Nonsemantic-Preserving Transformations in System Design," IEEE Transactions on Computer-Aided Design of Integrated Circuits and Systems, vol. 27, No. 6, Jun. 2008, pp. 1091-1103.
Sander, Ingo, "System Modeling and Design Refinement in ForSyDe," Royal Institute of Technology, Stockholm, Sweden, Apr. 2003, pp. 1-244.
SIGNALogic®, "Real•Time Composer™ Visual Environment," retrieved online at http://www.siQnalogic.com/inex.pl?page=vis_dsp (2004).
SIGNALogic®, "DSPower® Real-Time Code Generator," retrieved online at http://www.signalogic.com/index.pl?page=rtcg (2004).
Simulink® 7: User's Guide, The Math Works, Inc., Sep. 2009, pp. 1-1528.
The MathWorks, Simulink Model-Based and System-Based Design, Using Simulink, Version 4, The MathWorks, Inc., Jun. 2001.
The MathWorks, Simulink, Model-Based and System-Based Design, Using Simulink, Version 5, The MathWorks, Inc., Jul. 2002.
The MathWorks, "Simulink, Simulation and Model-Based Design, Writing S-Functions. Version 6," The MathWorks, Inc., Mar. 2005.
U.S. Appl. No. 12/963,433, filed Dec. 8, 2010 by Girish Venkataramani, et al. for a Hardware Definition Language Generation for Data Serialization From Executable Graphical Models, all pages.
U.S. Appl. No. 14/562,382, filed Dec. 5, 2014 by Yongfeng Gu, et al. for a Systems and Methods for Generating Optimized Hardware Descriptions for Models, pp. 1-51.

(56) References Cited

OTHER PUBLICATIONS

U.S. Appl. No. 14/562,647, filed Dec. 5, 2014 by Girish Venkataramani, et al. for a Systems and Methods for Estimating Performance Characteristics of Hardware Implementations of Executable Models, pp. 1-60.
Vogel. Thomas. "Simulink, sfunctlon with variable sized outputport possible?" retrieved online at: http://www.mathworks.com/matlabcentral/newsreader/view_thread/52973, Aug. 2003.
Woodward, Mike, "Getting Graphical in 3G Wireless Designs," CommsDesign, The MathWorks, Mar. 2003.
Woodward, Mike, "RadioLab 3G—a toolbox for 3G applications," pp. 1-5.
Woodward, Michael, "Getting graphical in wireless 3G designs," International Signal Processing Conference (2003).
"Working With Xilinx® Devices and Place and Route Tools," Altium, AP0112 (v1.0), Jan. 13, 2004, pp. 1-6.
Written Opinion for Application No. PCTIUS2Q06/036420, dated Jul. 2, 2007.
Zacher, Darren, "How to Use Register Retiming to Optimize Your FPGA Designs," Mentor Graphics, <http://www.eetimes.com/design/programmable-logic/4014801/How-to-use-register-retiming-to-optimize-your-FPGA-designs>, EE Times Group a UBM company, Dec. 14, 2005, pp. 1-5.

\* cited by examiner

SYSTEMS AND METHODS FOR TRACING PERFORMANCE INFORMATION FROM HARDWARE REALIZATIONS TO MODELS

CROSS-REFERENCE TO RELATED APPLICATIONS

The present application claims the benefit of U.S. Provisional Patent Application Ser. No. 61/912,200, filed Dec. 5, 2013, by Yongfeng Gu, Girish Venkataramani, and Rama Kokku for QUALITY OF RESULT DRIVEN, ITERATIVE WORKFLOW FOR MODEL-BASED HARDWARE DESIGN, which application is hereby incorporated by reference in its entirety.

BRIEF DESCRIPTION OF THE DRAWINGS

The disclosure below refers to the accompanying drawings, of which.

DETAILED DESCRIPTION OF ILLUSTRATIVE EMBODIMENTS

Figure 1:
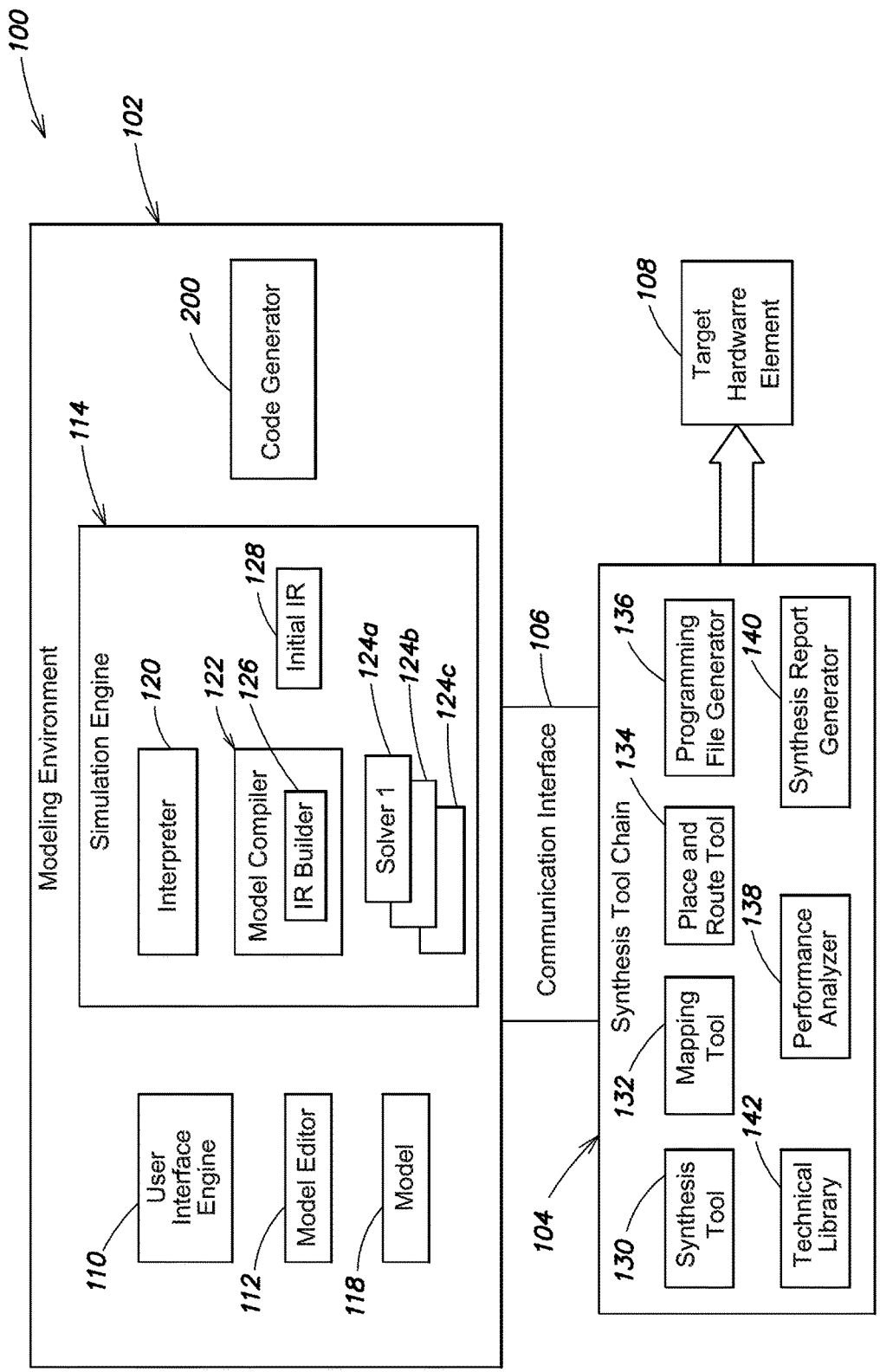
FIG. 1 is schematic diagram of a hardware development and optimization system according to an embodiment.

Briefly, embodiments of the disclosure relate to systems and methods, including workflows, for automatically generating optimized hardware description language (HDL) code for an executable model. The executable model may be a graphical model, such as a block diagram, that may represent a system. The model may include a plurality of model elements, such as blocks, and may further include connections among the model elements. Model elements may represent dynamic systems, state-based systems, and message-based systems, among others, and connections may represent signals, state transitions, events, control flow, and dataflow, among other communication types.

A modeling environment may include a simulation engine that generates an initial in-memory representation of the executable model, such as an intermediate representation. The initial in-memory representation may include a plurality of nodes that represent the model's elements, and edges that represent the model's connections. A code generator may subject the initial in-memory representation to a plurality of transforms resulting in the creation of a final in-memory representation. The final in-memory representation may have a structure that renders it suitable for emitting HDL code, and the code generator may generate HDL code from this final in-memory representation. A user may specify one or more constraints for a hardware implementation of the model. The one or more constraints may relate to the timing, area, and/or power consumption of the hardware implementation.

A synthesis tool chain may perform hardware synthesis from the generated HDL code. The synthesis tool chain may select hardware components for synthesizing the HDL code, and may generate a synthesis report that includes performance characteristics of the selected hardware components.

The code generator may obtain the performance characteristics from the synthesis tool chain, and may map the performance characteristics to the nodes of the final in-memory representation. The code generator may also trace the nodes of the final in-memory representation back to the nodes of the initial in-memory representation. As a result, the code generator may back-annotate the initial in-memory representation with performance characteristics obtained by the code generator from the synthesis tool chain.

The code generator may analyze the initial in-memory representation, back-annotated with performance characteristics, to identify one or more performance bottlenecks that prevent synthesized target hardware from satisfying the one or more constraints. The code generator may automatically select an optimization technique, based on the particular bottleneck that is identified. The code generator may also apply the selected optimization technique to the initial in-memory representation to produce a revised initial in-memory representation. The code generator may generate new HDL code from the revised initial in-memory representation. The process of performing hardware synthesis from HDL code, generating synthesis reports, mapping performance characteristics back to an initial in-memory representation, and applying an optimization technique may be repeated until the one or more constraints are satisfied, or until a termination criterion or event is met.

FIG. 1 is a schematic diagram of a hardware development and optimization system 100. The system 100 may include a modeling environment 102 and a synthesis tool chain 104. The modeling environment 102 and the synthesis tool chain 104 may be in communicating relationship through a communication interface 106, such as an Application Programming Interface (API), Remote Procedure Calls (PRCs), and/or Local Procedure Calls (LPCs), among other communication techniques. The synthesis tool chain 104 may synthesize a target hardware element 108. The target hardware element 108 may be an Application Specific Integrated Circuit (ASIC), a Field Programmable Gate Array (FPGA), a Complex Programmable Logic Device (CPLD), a System on a Chip (SoC), etc.

The modeling environment 102 may include a user interface (UI) engine 110, a model editor 112, a simulation engine 114, and a code generator 200. The UI engine 110 may create and present one or more User Interfaces (UIs), such as Graphical User Interfaces (GUIs) and/or Command Line Interfaces (CLIs), on one or more display devices of a computer processing device. The one or more GUIs and/or CLIs may be operated by users to perform various modeling tasks, such as opening, creating, and saving models, such as a computer-generated, executable graphical model 118. The GUIs and/or CLIs may also be used to enter commands, set values for parameters and properties, run models, change model settings, etc. The model editor 112 may perform selected operations, such as open, create, edit, and save, in response to user inputs.

The simulation engine 114 may include an interpreter 120, a model compiler 122, and one or more solvers, such as solvers 124a-c. The model compiler 120 may include one or more Intermediate Representation (IR) builders, such as IR builder 126. The simulation engine 114 may generate execution instructions for the model 118, and execute, e.g., compile and run or interpret, the model 118, using one or more of the solvers 124a-c. Exemplary solvers include one or more fixed-step continuous solvers, which may utilize integration techniques based on Euler's Method or Heun's Method, and one or more variable-step solvers, which may be based on the Runge-Kutta and Dormand-Prince pair.

The IR builder 126 may construct one or more in-memory representations or IRs from the model 126. In an embodiment, the IR builder 126 may construct an initial IR 128 that closely corresponds to the model 118. For example, the structure of the initial IR 128 may closely correspond to the structure of the model 118, and the model editor 112 may utilize the initial IR 128 to prepare a visual representation of the model 118 directly, e.g., without having to perform extensive manipulations or transformations to the initial IR 128.

The synthesis tool chain 104 may include a plurality of components. Specifically, the synthesis tool chain 104 may include a synthesis tool 130, a mapping tool 132, a place and route tool 134, a programming file generator 136, a performance analyzer 138, and a synthesis report generator 140. The synthesis tool chain 104 also may include a technical library 142.

In some embodiments, the modeling environment 102 is a high-level modeling environment. Suitable high-level modeling environments include the MATLAB® algorithm development environment and the Simulink® model-based design environment from The MathWorks, Inc., as well as the Simscape™ physical modeling system and the Stateflow® state chart tool also from The MathWorks, Inc., the MapleSim physical modeling and simulation tool from Waterloo Maple Inc. of Waterloo, Ontario, Canada, the LabVIEW virtual instrument programming system and the NI MatrixX model-based design product both from National Instruments Corp. of Austin, Tex., the Visual Engineering Environment (VEE) product from Agilent Technologies, Inc. of Santa Clara, Calif., the System Studio model-based signal processing algorithm design and analysis tool and the SPW signal processing algorithm tool from Synopsys, Inc. of Mountain View, Calif., a Unified Modeling Language (UML) system, a Systems Modeling Language (SysML) system, the System Generator system from Xilinx, Inc. of San Jose, Calif., and the Modelica modeling language from the Modelica Association, among others. Models created in the high-level modeling environment may contain less implementation detail, and thus operate at a higher level than certain programming languages, such as the C, C++, C#, and SystemC programming languages.

Those skilled in the art will understand that the MATLAB® algorithm development environment is a math-oriented, textual programming environment for digital signal processing (DSP) design, among other uses. The Simulink® model-based design environment is a modeling tool for modeling and simulating dynamic and other systems, among other uses. The MATLAB® and Simulink® environments provide a number of high-level features that facilitate algorithm development and exploration, and support model-based design. Exemplary high-level features include dynamic typing, array-based operations, data type inferencing, sample time inferencing, and execution order inferencing, among others.

In another embodiment, a lower level programming language, such as the C, C++, C#, and SystemC programming languages, among others, may be used to create one or more models.

Models constructed within the modeling environment 102 may include textual models, graphical models, such as block diagrams, and combinations of graphical and textual models. A given model may simulate, e.g., approximate the operation of, a system. Exemplary systems include weather systems, financial markets, plants, controllers, etc. A model may be executed in order to simulate the system being modeled, and the execution of a model may be referred to as simulating the model. For example, a GUI generated by the UI engine 110 and presented on a display of a data processing system may include a Run command that may be selected by a user to execute the model 118. Alternatively, a user may enter a run command in a CLI generated by the UI engine 110. In response to the user selecting the Run button or entering the run command, the simulation engine 114 may execute the model 118, and may present the results of the model's execution to the user, e.g., on a display.

The GUI generated by the UI engine 110 also may include a Code Generation command that may be selected by the user. Alternatively, the user may enter a code generation command in the CLI. In response to the user selecting the Code Generation button or entering the code generation command, the code generator 200 may generate code for at least part of the model 118.

Figure 2:
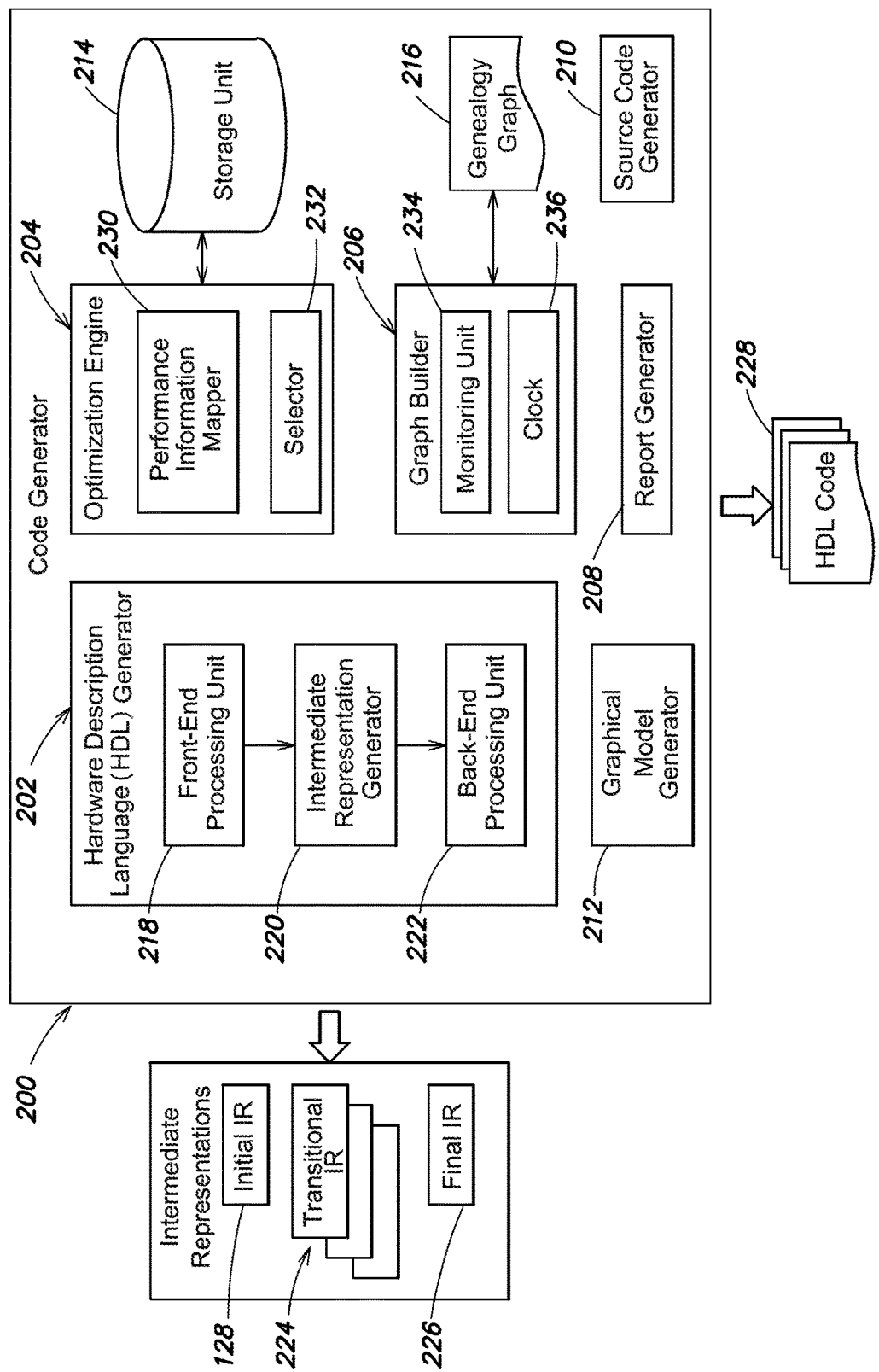
FIG. 2 is a schematic diagram of a code generator according to an embodiment.

FIG. 2 is a schematic, functional illustration of the code generator 200. The code generator 200 may include a hardware description language (HDL) generator 202, an optimization engine 204, a graph builder 206, a report generator 208, a source code generator 210, and a graphical model generator 212. The optimization engine 204 may have access to a storage unit 214 that stores optimization techniques. The graph builder 206 may construct and update one or more genealogy graphs, such as genealogy graph 216, which may be an in-memory data structure. The HDL generator 202 may include a front-end processing unit 218, an intermediate representation (IR) generator 220, and a back-end processing unit 222.

The IR generator 220 of the code generator 200 may be the same as the IR builder 126 of the model compiler 122, or it may be a different IR generator/builder. The IR generator 220 may construct or receive the initial IR 128 for the model 118. As described, the IR generator 220 may apply one or more transforms to the initial IR 128, resulting in the generation of a plurality of transitional IRs, indicated generally at 224, and ending with a final IR 226, from which code, such as HDL code 228 may be generated.

The optimization engine 204 may include a performance information mapper 230 and a selector 232. The graph builder 206 may include one or more sub-modules or sub-components, such as a monitoring unit 234 and a clock 236. The code generator 200 may include or have access to a validation engine (not shown). The validation engine, which may be part of the modeling environment 102, may receive the source model 118 and a validation model generated by the graphical model generator 212, and may run them to produce validation results for evaluation, e.g., by a user and/or programmatically.

The code generator 200 may operate upon the model 118 created or identified by the user. The model 118, which may be referred to as a source model, may be a high-level functional or behavioral model, such as a Simulink model, a Stateflow chart, a LabVIEW block diagram, a VEE diagram, etc. The code generator 200 may produce HDL code 228 corresponding to the source graphical model 118 that is optimized, and is bit true and cycle accurate (modulo a well-defined initial latency) to the simulation of the source graphical model 118. Exemplary HDL code 228 generated by the code generator 200 include VHDL code, Verilog code, SystemC code, System Verilog code, embedded MATLAB code, vendor or target specific HDL code, such as Xilinx FPGA libraries, etc.

In an embodiment, the code generator 200 may be implemented through one or more software modules or libraries containing program instructions and data structures pertaining to the methods described herein. The software modules may be stored in one or more memories, such as a main memory, a persistent memory and/or on computer readable media, of a workstation or other data processing machine or device, and executed by one or more processing elements, such as a general purpose processor, a central processing unit, etc. Other computer readable media may also be used to store and execute these program instructions, such as non-transitory computer readable media, such as optical, magnetic, or magneto-optical media. In another embodiment, the code generator 200 may be implemented in hardware comprising registers and combinational logic configured and arranged to produce sequential logic circuits. In alternative embodiments, various combinations of software and hardware, including firmware, may be utilized to implement the invention.

The storage unit 214 may be implemented through one or more data structures, such as linked lists, tables, databases, etc., stored in a memory.

It should be understood that FIGS. 1 and 2 are meant for illustrative purposes, and that the modeling environment 102, the code generator 200, and the synthesis tool chain 104 may be implemented in other ways. For example, the code generator 200, or one or more components thereof, may be separate from the modeling environment 102. In such cases, the code generator 200 may be in communication with the modeling environment 102 through local procedure calls (LPCs), remote procedure calls (RPCs), or one or more Application Programming Interfaces (APIs).

Suitable code generators for use with the present invention include, but are not limited to, the Simulink Coder, the Embedded Coder, and the Simulink HDL Coder products from The MathWorks, Inc. of Natick, Mass., and the TargetLink product from dSpace GmbH of Paderborn Germany. Nonetheless, other code generation systems and other compilers may be used.

An executable model, such as the model 118, or a portion thereof may be received by or identified to the code generator 200. The code generator 200 also may receive one or more hardware performance constraints on a hardware implementation of the model. Exemplary hardware performance constraints include timing, area, and/or power consumption. For example, a timing constraint may relate to the clock speed at which the target hardware element 108 is to operate, such as 200 MHz, 500 MHz, 1 GHz, etc. The timing constraint may be specified globally for the target hardware element 108. Alternatively, the timing constraint may be specified for a particular path through the model 118. An area constraint may specify a maximum number of logic elements, such as Lookup Tables (LUTs), Multipliers, Registers, Logic Slices, Digital Signal Processors (DSPs), Random Access Memory (RAM) blocks, Floating Point Units, Intellectual Property (IP) blocks, such as Altera Megafunctions from Altera Corporation of San Jose, Calif., Xilinx CORE Generation System from Xilinx Inc. of San Jose, Calif., and DesignWare from Synopsys, Inc. of Mountain View, Calif., among other vendor specific IP, of the target hardware element 108. A power constraint may specify a maximum power for the target hardware element 108.

The one or more hardware performance constraints may be user specified. For example, the UI engine 110 may present a GUI or CLI having one or more graphical affordances. A user may enter a desired hardware performance constraint through the one or more graphical affordances.

In some embodiments, the UI engine 110 may generate a user interface, such as a graphical user interface (GUI), for presentation to the user, e.g., on a display of a data processing device. The GUI may include one or more controls through which the user can select or specify options, such as the identification of the model 118 or one or more subsystems or other portions of the model 118 for which code generation is to be performed, and the one or more hardware performance constraints. The GUI also may include one or more command buttons through which the user can initiate code generation for the identified model or portion thereof.

It should be understood that the UI engine 110 may additionally or alternatively present a Command Line Interface (CLI) through which a user may identify the model 118 or portions thereof, specify the one or more constraints, and initiate the code generation process.

The code generator 200 may generate code, such as Hardware Description Language (HDL) code 228, automatically for the identified model 118 or portions thereof. In an embodiment, several stages may be involved in generating HDL code for the model 118. For example, the front-end processing unit 218 may perform a number of preliminary tasks, such as analyzing the syntax and semantics of the model 118, error detection and reporting, capturing dataflow relationships, determining block semantics, such as the type of block, determining particular block and/or subsystem parameter settings, as established by the user, etc. This information may be provided by the front-end processing unit 218 to the Intermediate Representation (IR) generator 220.

The IR generator 220 may generate a series of in-memory representations or IRs of the source model 118. As mentioned, the IR generator 220 may first construct the initial IR 128, which may closely correspond to the model 118. The transitional and final IRs 224 226, on the other hand, may have structures that differ, possibly significantly, from the structure of the model, as a result of the transforms applied to the IRs. For example, the initial IR 128 may include a plurality of nodes interconnected by edges, and the nodes may correspond to blocks of the model 118, and the edges may correspond to the signals of the model 118. The IR generator 220 may then perform a series of transforms starting with the initial IR 128 and producing the plurality of transitional IRs 224 until the final IR 226 is produced. Exemplary transforms include procedure in-lining, loop transformations, global and local optimizations, register allocation, and target-dependent optimizations. The particular transforms that are applied may start on the initial IR 128 and produce a final IR 226 suitable for HDL code generation. That is, the final IR 226 is in a form and structure that is suitable for use in generating the HDL code 228.

In an embodiment, one or more of the initial IR 128, the transitory IRs 224, and the final IR 226 may be graph-based, object-oriented structures. For example, one or more of the IRs may be in the form of a hierarchical, Data Flow Graph (DFG), or in the form of a Parallel Intermediate Representation (PIR), which has a plurality of IR objects, including nodes interconnected by edges. The nodes of the PIR represent blocks from the designated model 118 or portions thereof in an abstract manner. The edges of the PIR represent the connections between the blocks of the model 118. Special nodes, called network instance components (NICs), provide hierarchy in the PIR, for example, by abstractly representing subsystems of the model 118. For example, each block of the model 118 may map to one or more nodes of the PIR, and each connecting line or arrow of the model 118 may map to one or more edges of at least the initial PIR 128.

In an embodiment, the initial IR 128 may have a plurality of hierarchically arranged levels. For example, the initial IR 128 may be a top-level of the in-memory representation of the source model 118, and one or more of the components of the initial IR 128 may be a particular type or form of in-memory representation. For example, one or more nodes of the initial IR 128 may a Control Flow Graph (CFG), Control Data Flow Graph (CDFG), program structure tree (PST), abstract syntax tree (AST), etc. A CDFG may capture the control flow as well as the data flow of a graphical model through data dependency and control dependency edges. The initial IR 128 and the final IR 226 may be saved to memory, such as a main memory or a persistent memory of a data processing device. One or more, or even all, of the transitional IRs 224 also may be saved in memory. Additionally or alternatively, one or more snap shots may be taken of the IR during the code generation process at selected milestones of the compilation process, such as following particular transforms, optimizations, or other compilation operations. The initial, transitional, and final IRs may each represent particular snap shots as the IR evolves during the compilation process. These snap shots of the IR may be stored in memory, and may be retrieved or restored during evaluation of the code generation process.

Genealogy Graph

The monitoring unit 234 of the graph builder 206 may monitor the processing of the initial IR 128 including the generation of each of the transitional IRs 224 and the generation of the final IR 226. The graph builder 206 may record the changes being made to the IRs 128 and 224 in the genealogy graph 216 for the model 118. In particular, the graph builder 206 may construct and update the genealogy graph 216

Figure 4:
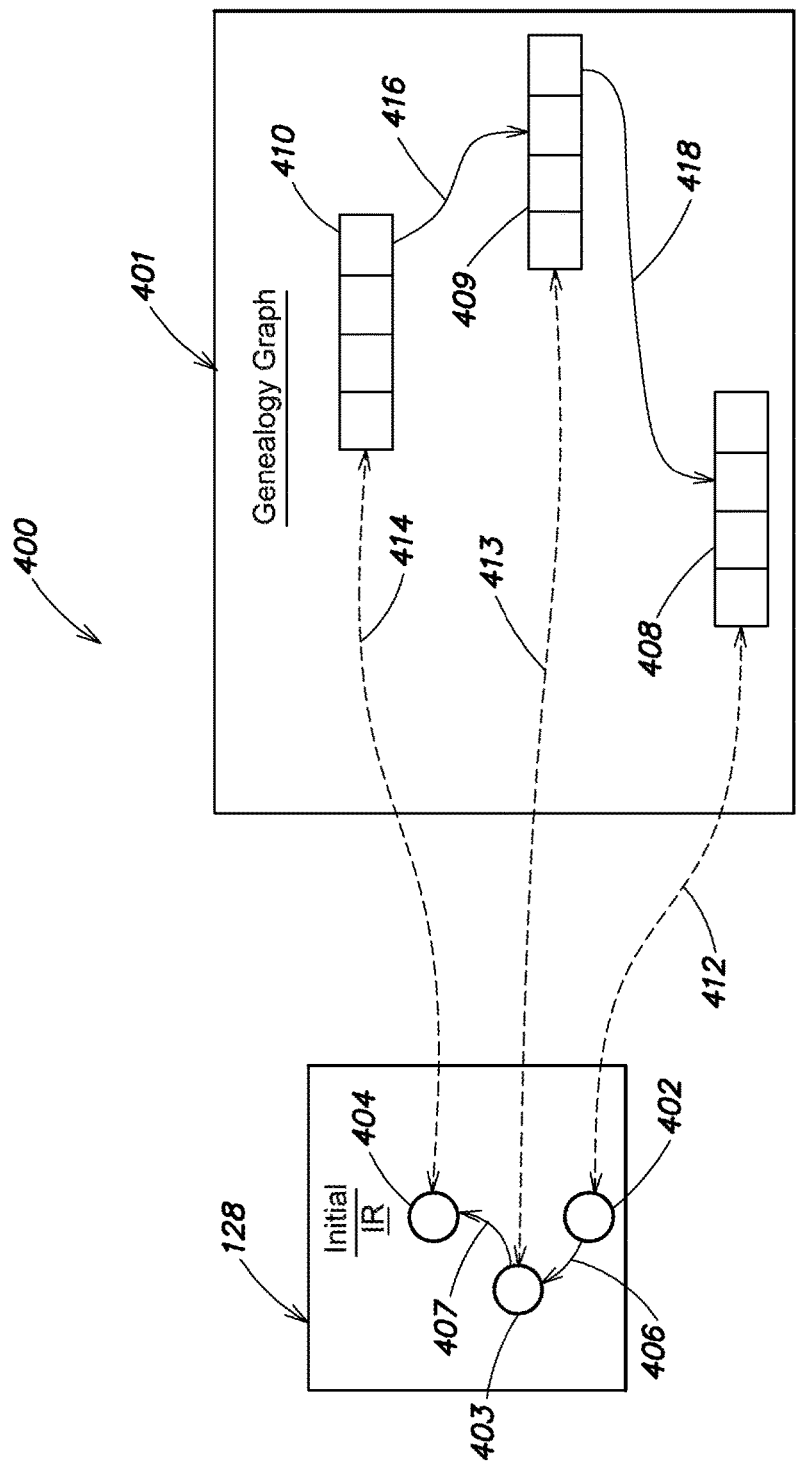
FIG. 4 is a schematic diagram illustrating the relationship between an intermediate representation and a genealogy graph in accordance with an embodiment.

FIG. 4 is a schematic diagram 400 illustrating the relationship between the initial IR 128 and a genealogy graph 401. The initial IR 128 may include a plurality of IR nodes interconnected by IR edges. For example, the initial IR 128 may include first, second, and third nodes 402-404 interconnected by first and second edges 406 and 407. For each node of the initial IR 128, the graph builder 206 may construct a graph object of the genealogy graph 401. In particular, the graph builder 206 may construct first, second, and third graph objects 408-410, and include them in the genealogy graph 401. The first graph object 408 is associated with the first IR node 402 of the initial IR 128 as indicated by dashed arrow 412. Similarly, the second and third graph objects 409 and 410 are associated with second and third nodes 403 and 404 of the initial IR 128, respectively, as indicated by dashed arrows 413 and 414. The graph objects 408-410 may include data, such as records having fields configured to store information.

Edges of the genealogy graph may provide information regarding source and destination relations among the IR nodes of a given IR as well as relations among IR nodes of different IRs resulting from transformations and other compiler operations during compiler flow. An edge may represent a deriving relation between two IR nodes of two IRs. A parent IR node, moreover, may have multiple children nodes, and a child IR node may have multiple parent IR nodes. For example, one scalar signal may be created from another vector signal. The graph object for the scalar signal may point to the graph object for the vector signal, and the edge may be marked with 'scalarization'. At the same, the scalar signal may be created in a subsystem. The genealogy graph may include an edge from graph object for the scalar signal to the graph object for the subsystem, and the edge may be marked with 'signal creation in network'.

Figure 5:
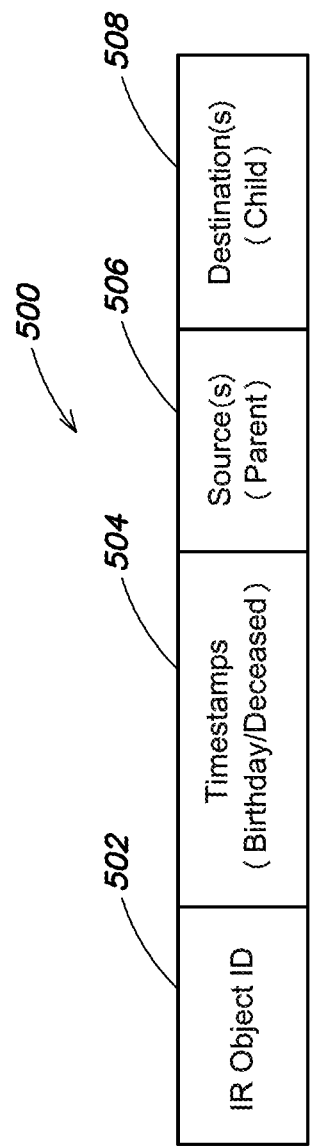
FIG. 5 is a schematic diagram of a data structure according to an embodiment.

FIG. 5 is a schematic illustration of a graph object 500. The graph object 500 may include an IR Object Identifier (ID) field 502, a timestamps field 504, a source field 506, and a destination field 508. When an IR node is created by the IR generator 220 during the performance of the transform, the graph builder 206 may construct a corresponding graph object of the genealogy graph 401. The graph builder 206 may enter information identifying the respective IR node in the graph object's IR object ID field 502. The information may provide a link to the respective IR node. In an embodiment, the HDL generator 202 may assign identifiers to the IR nodes, such as numeric or alphanumeric identifiers. The identifier may uniquely identify each IR node for at least each code generation process. The graph builder 206 may utilize these assigned identifiers as the IR node identifiers in the IR object ID fields 502, thereby associating or assigning the graph objects to their respective IR nodes. In addition, the HDL generator 202 may add a pointer to the IR nodes where the pointers point to the graph objects associated with or assigned to the respective IR nodes.

The graph builder 206 also may enter a time in the timestamp field 504 that corresponds to the time at which node of the IR is created, e.g., the node's 'birthday'. In an embodiment, the graph builder 206 may use a virtual time. For example, at the beginning of the code generation flow, the graph builder 206 may reset the clock 236, e.g., to zero. Graph objects for the IR nodes of the initial IR may have a timestamp value of zero. As the code generation and compiler flow process proceeds, the value generated by the clock 236 increments, and the current value or timestamp of the clock 236 may be read by the graph builder 206 when a graph object is created, and this current value or timestamp may be stored in the graph object's timestamps field 504. The graph builder 206 may also enter a time corresponding to the time at which an IR node is deleted in the timestamps field 504, e.g., the node's 'deceased' time. For example, when an IR node is deleted, the graph builder 206 may enter, in the timestamps field 504, the time as specified by the clock 236. It should be understood that the clock 236 may track other times, which may then be used as the timestamps for graph objects.

In addition, to the extent a newly created IR node bears some relation to an earlier created IR node, the graph builder 206 may enter information in the destination field 508 of the graph object 500 identifying the earlier created graph object (s) for the IR nodes to which the graph object 500 for the newly created IR node bears a relation. The graph builder 206 also may enter information in the source fields 506 of these earlier created graph objects identifying the later created graph object(s). Referring to FIG. 4, the third graph object 410 includes a pointer to the second graph object 409, as indicated by arrow 416, and the second graph object 406 includes a pointer to the first graph object 408, as indicated by arrow 418.

As noted, the IR generator 220 may apply a transform to the initial IR 128 thereby creating a first transitional IR. The IR generator 220 may then apply a transform to the first transitional IR creating a second transitional IR. The IR generator 220 may continue to apply transforms creating additional transitional IRs until ending up with the final IR 226. As each transitional IR 224 is created, the graph builder 206 constructs new graph objects for the transitional IR's nodes.

Figure 6:
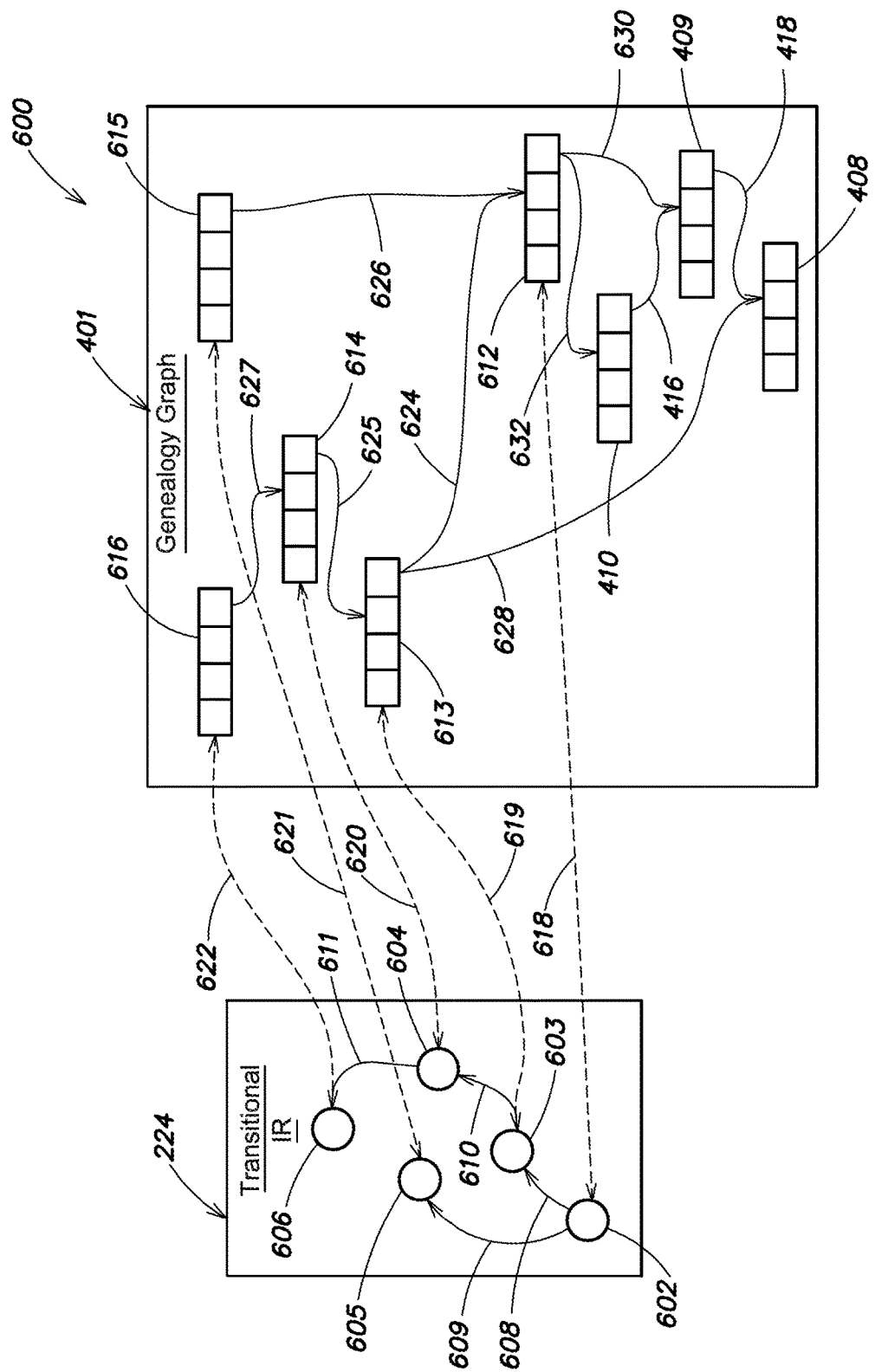
FIG. 6 is a schematic diagram illustrating the relationship between an intermediate representation and a genealogy graph in accordance with an embodiment.

FIG. 6 is a schematic diagram 600 illustrating the relationship between a transitional IR 224 and the genealogy graph 401. The transitional IR 224 may include a plurality of nodes 602-606 interconnected by edges 608-611. The genealogy graph may include graph objects 612-616 correspond to the plurality of nodes 602-606, as indicated by dashed arrows 618-622. The graph objects 612-622 may include pointers 624-627 that correspond to the edges 608-611 of the transitional IR 224. In an embodiment, once created, graph objects of the genealogy graph 401 are not deleted or modified, other than possibly adding information to the source fields 506. For example, even though the initial IR 128 may be replaced by a transitional IR 224, and new graph objects 612-616 have been added to the genealogy graph 401 corresponding to the nodes 602-606 of the transitional IR 224, the graph builder 206 may maintain within the genealogy graph 401 the graph objects 408-410 created for the nodes of the initial IR 128. Accordingly, while a plurality of IRs are generated, including the initial IR 128, the transitional IRs 224, and the final IR 226, a single genealogy graph 401 may be created and maintained for all of the IRs.

The graph objects of the genealogy graph 401 are thus linked together in source-destination or parent-child relationships. In addition, the graph builder 206 may annotate the edges in the genealogy graph 401 with information concerning the transform to the IR that resulted in the creation of a new graph object. For example, the edges may be annotated with the names of the respective transforms or a value that identifies the transform.

For example, suppose, during a transform of the initial IR 128, that an IR node, such as IR node 403, is deleted. The graph builder 206 may retain the corresponding graph object 409 in the genealogy graph 401 for the deleted IR node 403 of the initial IR 128. That is, the graph builder 206 does not delete the corresponding graph object 409 for the deleted IR node 403.

Deletion of an IR node may result in the deletion of all of the IR node's properties, including the pointer from the IR node to its graph object. Nonetheless, the graph object for the deleted IR node is not deleted from the genealogy graph 216, and the graph object continues to retain the unique ID assigned to the now deleted IR node. In addition, to the extent other IR nodes are derived from the now deleted IR node, the graph objects for these other IR nodes will contain links to or from the graph object associated with the now deleted IR node.

The graph builder 206 may also provide a link between graphical objects of different IRs to represent a relationship between the respective nodes of the different IRs. For example, suppose, during a transform of the initial IR 128, that an IR node is renamed. The graph builder 206 may construct a new graph object, such as graph object 613 for the renamed IR node. In addition, the graph builder 206 may include an edge, such as edge 628, that links the newly created graph object 613 to the graph object 408 created for IR node 402. In addition, the graph builder 206 may annotate this edge 628 with the name of the transform that resulted in the creation of the new graph object 613, e.g., rename operation. The original graph object 408 for the originally named IR node 402 may be retained in the genealogy graph 401.

If an IR node is split into two nodes during a transform, the graph builder 206 may create two new graph objects for the two new IR nodes. The graph builder may include the current time at which the new graph objects are created in the new objects' timestamp fields 504. The graph builder 206 may also link the two new graph objects to the graph object associated with the original IR node, and may annotate or label the edges with the name of the transform that resulted in the creation of the two new graph objects, e.g., split operation.

If two IR nodes are merged into a single IR node, the graph builder 206 may create one new graph object that represents the merged IR node. The graph builder 206 may include the current time at which the new graph object was created in the object's timestamp field 504. The graph builder 206 may also link this newly created graph object to the two graph objects associated with the two IR nodes that were merged. For example, suppose that nodes 403 and 404 of the initial IR 128 are merged into node 602 of the transitional IR 224. The graph builder 206 may create the graph object 612 for node 602, and may provide edges 630 and 632 linking graph object 612 to graph objects 409 and 410.

Figure 7:
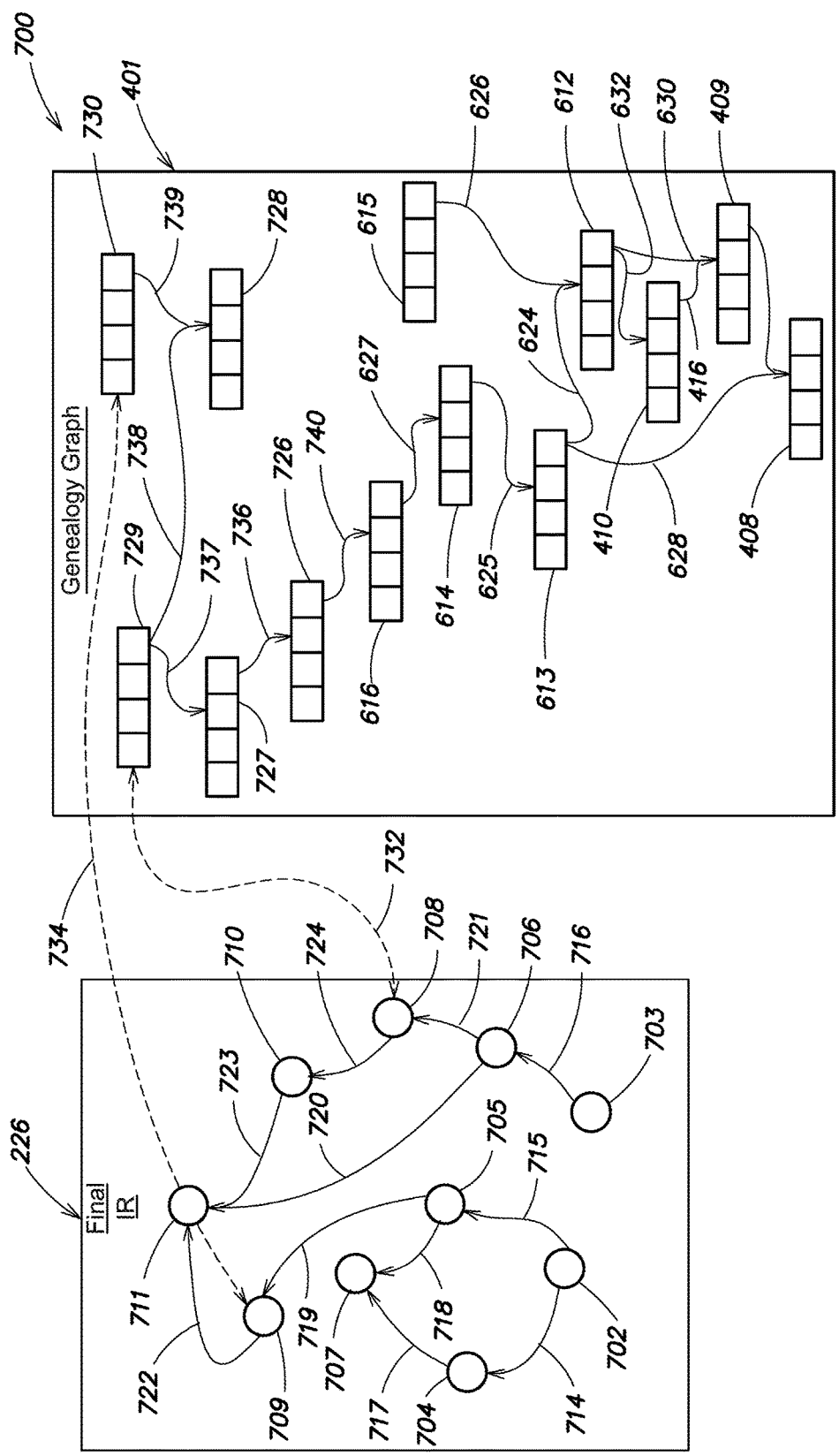
FIG. 7 is a schematic diagram illustrating the relationship between an intermediate representation and a genealogy graph in accordance with an embodiment.

FIG. 7 is a schematic diagram 700 illustrating the relationship between the final IR 226 and the genealogy graph 401. The final IR 226 may include a plurality of nodes 702-711, connected by a plurality of edges 714-724. The genealogy graph 401 may include new graph objects, such as graph objects 726-730, for nodes of the final IR 226. For example, the graph object 729 may correspond to node 708, as indicated by dashed arrow 732, and the graph object 730 may correspond to node 711, as indicated by dashed arrow 734. The graph builder 206 may include edges, such as edges 736-739, connecting the graph objects 726-730 to each other, and edges, such as edge 740, connecting one or more of the graph objects 726-730 to graph objects of one or more of the transitional IRs 224.

In an embodiment, the unique identifiers assigned to the IR nodes may be deterministic. Accordingly, each time a given model goes through code generation, the IR nodes will be given the same unique identifiers.

The genealogy graph 401 thus provides a temporal view of IR nodes of the initial IR 128, the transitional IRs 224, and the final IR 226. The IR generator 220 may issue calls to the graph builder 206 as the initial IR 128 and the transitional IRs 224 are mutated in response to the transforms. It should be understood that FIG. 4 is meant for illustration purposes only and that the IRs 128, 224, and 226 and the genealogy graph 401 may include many more or fewer nodes and edges and have far more or less complex structures.

Name Delimiters

The synthesis tool chain 104 may mangle original function and variable names appearing in the generated HDL code 228 when processing that HDL code 228 to configure the target hardware element 108. Name mangling, also known as name decoration, typically involves adding characters or terms to function and variable names in order to pass additional semantic information, for example, from compilers to linkers. Name mangling can make it difficult to trace function, variable, or other component names back to the originally specified function and variable names, such as the function and variable names appearing in the HDL code 228.

The back-end processing unit 222, which may interface with the IR generator 220 to generate the HDL code 228 from the final IR 226, may utilize delimiters to facilitate tracing function and variable names from components generated by the synthesis tool chain 104 back to the generated HDL code 228. For example, the back-end processing unit 222 may add preselected delimiters to the names appearing in the HDL code 228. For example, the back-end processing unit 222 may add delimiters to function names and variable names. As described herein, these delimiters may be used to map hardware components synthesized by the synthesis tool chain 104 back to the functions and variables of the HDL code 228. The back-end processing unit may insert special, predetermined symbols into the final IR 226 and/or the HDL code 228 to mark the start and the end of function names and variable names. While function and variable names may end up being mangled by the hardware synthesis tool chain 104 during the synthesis process, these special, predetermined symbols may remain in the name of the hardware components, including the component names appearing in the bitstream or other representations created by the hardware synthesis tool chain 104. Accordingly, these special, predetermined symbols may also appear in the synthesis report generated by the hardware synthesis tool chain 104. By looking for these special, predetermined symbols in the names of hardware components appearing in the synthesis report generated by the hardware synthesis tool chain 104, the optimization engine 204 may map hardware components created or defined by the synthesis tool chain 104 back to respective functions and variables of the HDL code 228.

The back-end processing unit 222 may select characters that rarely appear in function and variable names as the special, predetermined characters.

It should be understood that other techniques besides the insertion of special, predetermined symbols may be used. For example, the HDL generator 202 may use a hamming distance based on encoded names.

The HDL code 228 automatically generated by the code generator 200 from the model 118 may be provided to the synthesis tool chain 104. The modeling environment 102 may use the communication interface 106 to provide the HDL code 228 to the synthesis tool chain 104. The HDL 228 code may be Register Transfer Level (RTL) code, such as code compatible with the VHDL, Verilog, or SystemC hardware description languages.

It should be understood that the source code generator 210 may generate code for the source model 118 that is in a form, such as a C-language variant, used as an input to hardware synthesis. This source code may be in addition to or instead of the HDL code 228.

The synthesis tool chain 104 may utilize the HDL code 228 received from the modeling environment 102 to synthesize the target hardware element 108. The synthesis tool chain 104 is configured to convert the HDL code 228 to a technology and target specific bitstream for configuring the target hardware element 108. To configure an ASIC, the synthesis tool chain 104 may generate a target-specific, gate-level representation rather than a bitstream.

The synthesis process may involve a number of stages. For example, the synthesis tool 130 may convert the received HDL code 228 into a netlist file. The mapping tool 132 may map logic in the netlist file to hardware components available on the target hardware, such as logic cells, I/O cells, lookup tables, etc. For an ASIC, logic may be mapped to standard cells from a user-provided ASIC technology library. The synthesis tool 130 and/or the mapping tool 132 may access the technical library 142 to select particular hardware components and hardware component implementations. The mapping tool 132 may produce a native circuit description (NCD) file. The place and route tool 134 may receive the NCD file and select fixed positions on the target hardware element 108 for the hardware components. The place and route tool 134 may also route required connections between the placed hardware components using the target hardware's routing channels. The place and route tool 134 may produce a revised NCD file. The programming file generator 136 may receive the revised NCD file from the place and route tool 134, and generate one or more files suitable for configuring the target hardware element 108, such as a bitstream file. The bitstream file may be used directly to configure the target hardware element 108. For example, the synthesis tool chain 104 may be connected to the target hardware 108, and the bitstream downloaded to the target hardware element 108.

The synthesis tool chain 104 may create other files such as a Standard Delay Format (SDF) file.

In an embodiment, the target hardware element 108 may not be configured by the synthesis tool chain 104 until the code generator 200 generates final, optimized HDL code.

The performance analyzer 138 may determine the utilization and performance of the hardware implementation of the generated HDL code 228. The synthesis report generator 140 may generate one or more synthesis reports that specify the area, timing, and/or power characteristics of the target hardware element 108, including the area, timing, and power characteristics of the hardware components implemented on the target hardware element 108, as determined by the performance analyzer 138.

The code generator 200 may access the synthesis report generated by the synthesis tool chain 104. For example, the synthesis tool chain 104 may expose an Application Programming Interface (API) through which an application can access the synthesis reports and/or data included in the synthesis reports. The code generator 200 may utilize this API to access the synthesis report. It should be understood that the format and information included in a particular synthesis report may vary depending on the vendor of the synthesis tool chain 104. The code generator 200 may be configured with vendor-specific information concerning the format and information available from the synthesis reports generated by the synthesis tool chains of one or more vendors. The code generator 200 may utilize this vendor-specific information to form API calls to the synthesis tool chain 104 to obtain the synthesis report or data therefrom. In particular, the code generator 200 may utilize this vendor-specific information to filter the synthesis report for particular information utilized by the optimization engine 204. Information concerning the API and/or API calls may be stored in a storage unit accessible by the code generator 200. The code generator 200 may perform a lookup on the data store and retrieve the API and/or API calls to be used with a particular synthesis tool chain 104 to obtain the information utilized by the system 100. Accordingly, the code generator 200 may interoperate with synthesis tool chains 104 from different vendors. For example, while the synthesis tool chain 104 may be made by Vendor A, it could be swapped out with a synthesis tool chain made by Vendor B.

In some embodiments, the hardware synthesis tool chain 104 may not generate a synthesis report. For example, instead of a synthesis report, a hardware synthesis tool chain may generate design objects. The design objects may be in-memory data structures that may resemble a C++ class, and may include performance data. The code generator 200 may access these design objects and extract performance data. For example, the code generator 200 may issue methods and/or function calls to the design objects, and in response obtain performance data. It should be understood that the synthesis tool chain 104 may construct other storage items or data structures for storing the performance data.

Exemplary synthesis tool chains include the Design Compiler from Synopsys, the Encounter RTL Compiler from Cadence, Quartus from Altera, XST from Xilinx, Precision RTL from Mentor Graphics, and Vivado Design Suite from Xilinx, among others.

If the optimization engine 204 is attempting to resolve timing-related constraints, it may obtain timing or other information, e.g., from the synthesis report, regarding the critical path or paths as determined by the synthesis tool chain 104. For area-related constraints, the optimization engine 204 may obtain a mapping summary report generated by the synthesis tool chain 104 to see how parts of the source model 118 were mapped to hardware elements, such as DSPs, RAMs, IP components, etc. The code generator 200 may extract information from other files generated by the synthesis tool chain 104, such as the SDF file.

The performance information mapper 230 of the optimization engine 204 may map the component-level performance data to the nodes of the final IR 226. In an embodiment, the performance information mapper 230 may search performance data retrieved from the synthesis tool chain 104 for the preselected delimiters that were inserted in the names used in the HDL code 228. The performance information mapper 230 may map the hardware components to their corresponding nodes in the final IR 226. In particular, the synthesis tool chain 104 may generate new names for the hardware components selected to implement portions of the HDL code 228. Nonetheless, these names may still include the delimiters that were added into the HDL code 228 by the back-end processing unit 222. Accordingly, by searching the component-level performance data extracted from the synthesis report for the delimiters, the performance information mapper 230 can map that performance information to IR objects of the final IR 226.

Figure 8:
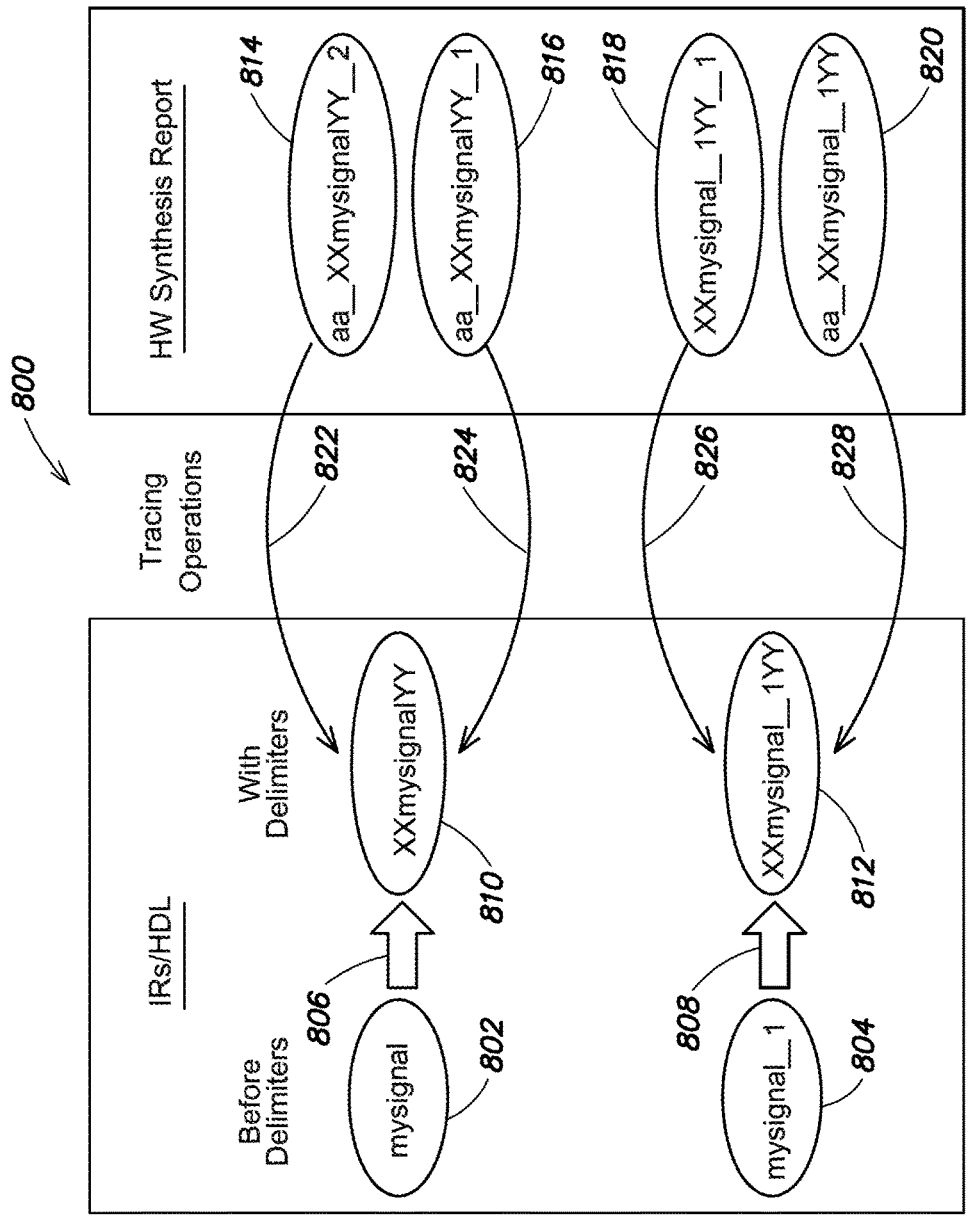
FIG. 8 is a schematic diagram illustrating the relationship between performance data from a synthesis report and generated HDL code in accordance with an embodiment.

FIG. 8 is a schematic diagram 800 of the relationship between performance data from a synthesis report and the delimiters included in the HDL code 228. Suppose, for example, that the final IR 226 and/or the generated HDL code 228 includes two signals 802 and 804 named 'mysignal' and 'mysignal_1'. The back-end processing unit 222 may modify the final IR 226 and/or the generated HDL code 228 by appending delimiters, e.g., special, predetermined symbols, to module and variable names, as indicated by arrows 806 and 808. For example, the symbols may be 'XX' and 'YY', and these symbols may bracket the original names. Thus, signal names 'mysignal' 802 and 'mysignal_1' 804 may become signal names 'XXmysignalYY' 810 and 'XXmysignal_1YY' 812.

During the synthesis process, the synthesis tool chain 104 may modify the names of the signals 802 and 804. For example, the synthesis tool chain 104 may generate signal names 'aa_XXmysignalYY_2' 814, 'aa_XXmysignalYY_1' 816, 'XXmysignal_1YY_1' 818, and 'aa_XXmysignal_1YY' 820. As shown, the synthesis tool chain 104 has mangled the original names appearing the HDL code 228, e.g., by adding additional terms, such as 'aa' and '_1'. Nonetheless the performance information mapper 230 can map the mangled names back to the names used in the generated HDL code 228, and back to the original names in the final IR 226 and/or the generated HDL code 228 through the use of the delimiters. For example, by searching the mangled names of the synthesis report for names appearing between the special, predetermined symbols, e.g., 'XX' and 'YY', the performance information mapper 230 can map the names back to the generated HDL code 228 and to the final IR 226, as indicated by arrows 822, 824, 826, and 828. The performance information mapper 230 can thus map hardware component-level performance data generated by the synthesis tool chain 104, as included in the synthesis report, to names used in the final IR 226.

The performance information mapper 230 also may map the hardware component-level performance data from the final IR 226, through the transitional IRs 224, to the initial IR 128. The mapper 230 may use the genealogy graph 216 to trace the objects of the final IR 226 to the initial IR 128, and thus map the performance data to the IR objects of the initial IR 128. To map performance data from the final IR 226 back through the given transitional IRs 224 to the initial IR 128, the performance information mapper 230 may follow a graph object for a node of the final IR 226 to one or more graph objects for one or more nodes of the initial IR 128. For example, the performance information mapper 230 may trace back graph objects using a breadth-first search following the edges of the genealogy graph 216 until one or more graph objects having a birthday or timestamp that is equal to or earlier than the birthday or timestamp corresponding to the initial IR 128. It should be understood that, by using a different birthday or timestamp as an input, the performance information mapper 230 may map nodes of the final IR 226 to nodes of a selected transitional IR 224. The performance information mapper 230 may thus receive as inputs a given node of the final IR 226 and a timestamp. The performance information mapper 230 may output the set of IR nodes that trace back from the given node to a time that is equal to or earlier than the received timestamp. In this way, performance data generated by the synthesis tool chain 104, including the identity of critical paths, may be traced back to the initial IR 128, and thus back to the original source model 118.

Figure 9:
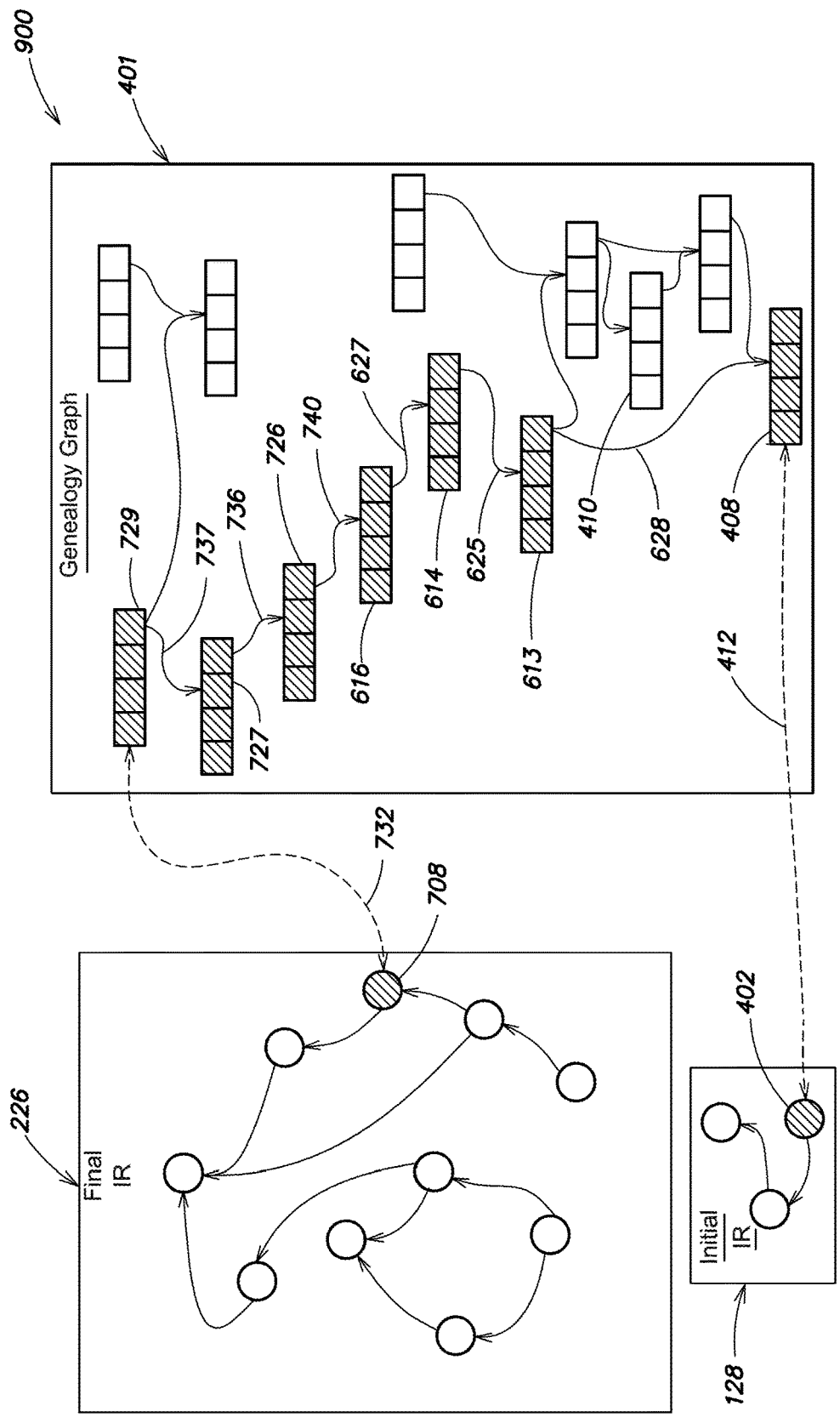
FIG. 9 is a schematic diagram illustrating the tracing of performance information using a genealogy graph, in accordance with an embodiment.

FIG. 9 is a schematic diagram 900 illustrating the use of the genealogy graph 401 to trace performance data from the final IR 226 to the initial IR 128. For example, suppose the performance information mapper 230 has mapped performance data obtained from the synthesis tool chain 104 to a node of the final IR 226, such as node 708. As noted, node 708 corresponds to graph object 729 of the genealogy graph 401. The performance information mapper 230 may utilize the edges of the genealogy graph 401, among other information, to trace the node 708 of the final IR 226 to one or more nodes of the initial IR 128. For example, the performance information mapper 230 may follow edges 737, 736, 740, 627, 625, and 628 through graph objects 727, 726, 616, 614, and 613 to graph object 408, as indicated by the hash markings. Graph object 408 corresponds to node 402 of the initial IR 128, as indicated by the dashed arrow 412. The performance information mapper 230 may thus assign the performance data for node 708 of the final IR 226 to node 402 of the initial IR 128. In addition, the performance information mapper 230 may assign this performance information for node 402 to the one more model elements represented by node 402 of the initial IR 128, as the initial early IR 128 closely corresponds to the model 118.

It should be understood that name mangling using delimiters is one approach for matching performance data of the synthesis tool to the final IR. In some embodiments, the code generator may generate unique names for functions and/or variables, e.g., using hamming distances.

The optimization engine 204 may designate the critical path within the model 118, and the UI engine 110 may use a graphical affordance to illustrate or show the critical path to a user. For example, the UI engine 110 may highlight the critical path with a color, e.g., red, on a visual representation of the model 118, e.g., on a display or other output device. Even with the use of name mangling or other tracing techniques, there may be IR nodes along the critical path for which information either cannot be derived from the synthesis report generated by the synthesis tool or is not available from the synthesis report. In some embodiments, the optimization engine 204 may use interpolation or extrapolation techniques, or other heuristics, to fill such gaps.

The critical path may occur within a single model element of the model 118 that cannot be reduced by a user. That is, a model element representing one or more complex functions or operations may include a plurality of core or low-level components. The modeling environment 102, however, may not permit access to the plurality of core components that make up the model elements. For example, the arrangement of core components, which make up the model element, may be masked from the user. Nonetheless, the optimization engine 204, which may operate on the initial IR 128, may have access into the model element to its core components. Accordingly, the optimization engine 204 may identify a critical path that exists within a single model element defined by the modeling environment 102.

Using the performance data as mapped to the initial IR 128, the optimization engine 204 may determine one or more hardware performance attributes of the model 118. The performance attributes may include timing, area, and power. The optimization engine 204 may utilize the performance attributes to determine automatically whether the one or more constraints specified for the hardware implementation of the model 118 are satisfied. If the one or more constraints are not satisfied, the optimization engine 204 may determine whether a termination criterion is met.

If the termination criterion is not met, the optimization engine 204 may use the performance data to identify one or more bottlenecks in the original model 118 that may be preventing the one or more constraints from being satisfied.

Suppose for example, that the one or more constraints concerns the timing to be achieved by a hardware implementation of the model 118, and that the timing constraint was not achieved. To improve the timing of the hardware implementation, the optimization engine 204 may identify the critical path within the model 118.

Using the name delimiters and the genealogy graph 216, the optimization engine 204 may back annotate the initial IR 128, which closely resembles the model 118 with the performance data from the synthesis report, such as latency and area information.

Figure 10:
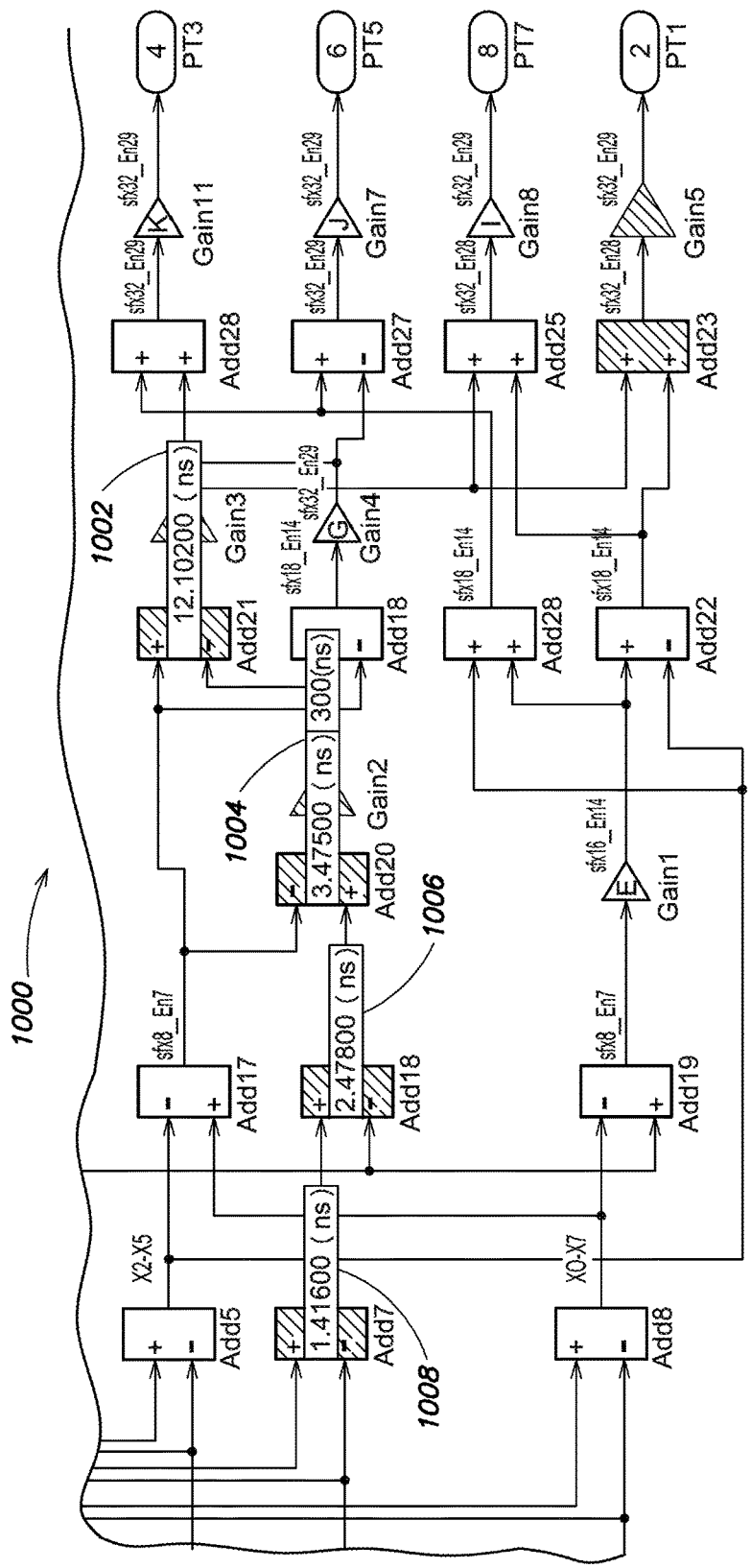
FIG. 10 is a schematic diagram of a portion of a model in accordance with an embodiment.

FIG. 10 is a schematic diagram of a visual display of a portion of a graphical model 1000 that has been back annotated with latency information. The model 1000 includes a plurality of model elements, and the optimization engine 204 may annotate at least some of the model elements with the latency information obtained from the synthesis report and back-annotated to the initial IR 128. The latency information may be represented in terms of time, e.g., nanoseconds (ns). For example, the UI engine 110 may add data boxes, such as data boxes 1002-1008, adjacent to blocks of the model 1000, where the data boxes 1002-1008 contain the latency of the respective blocks. In an embodiment, the optimization engine 204 may identify the critical path in the model 1000, and may back annotate the elements of the model 1000 determined to be on the critical path with latency information obtained from the synthesis report.

Once the optimization engine 204 identifies the bottleneck in the model 118, the selector 232 may select one or more optimizations from the set of available optimization techniques stored in the storage unit 214 to resolve the bottleneck. In an embodiment, the selector 232 may apply one or more heuristics to choose the optimization to be applied. The optimization engine 204 may modify one or more of the IRs, such as the initial IR 128, according to the selected optimization technique. The optimization techniques may be designed to maintain the functional integrity of the source model 118. For example, the optimization technique may be designed such that the model, following application of the optimization technique, produces results that are substantially equivalent to the original model. In some embodiments, the degree or level of equivalence with the source model 118 may be specified, e.g., in terms of a constraint, programmatically or through user input, and the optimization engine 204 may determine whether the optimized model satisfies this constraint.

For example, suppose the constraint concerns timing. The optimization engine 204 may select an optimization technique that increases the speed of a hardware implementation of a model, such as pipelining and/or adding registers to the identified critical path. The optimization engine 204 may modify the initial IR 128 by incorporating pipelining and/or register additions into the initial IR 128. The revised initial IR may be provided to the graphical model generator 212, which may produce a visual representation of a revised model from the revised initial IR, and the UI engine 110 may present the revised model to the user, e.g., on a display.

To the extent pipelining and/or register additions were incorporated into the revised initial IR, these new nodes may have corresponding model elements in the revised model, such as new blocks. For example, new delay blocks may be included in the revised model indicating the addition of registers. The user may examine the revised model to observe the changes made by the optimization engine 204 in an effort to satisfy the one or more constraints.

The optimization engine 204 may choose pipelining, e.g., adding pipeline registers to the critical path, as a first optimization technique to improve timing. However, if pipelining invalidates the functional integrity of the revised model, for example the location to add a register is in a feed-back loop, the optimization engine 204 may choose distributed pipelining, e.g., moving existing registers in the design to reduce the latency of the critical path.

For a constraint concerning area, the selector 232 of the optimization engine 204 may select an optimization technique for reducing area. A first optimization technique may call for replacing nodes of the first IR with other versions of the node that, when implemented in hardware, use less area. For example, for a given model element, such as an Adder block, there may be more than one possible in-memory representation. A first in-memory representation, such as a first set of nodes, may be optimized for speed, while a second in-memory representation, such as a second set of nodes, may be optimized for area. When the constraint seeks to minimize area, the selector 232 may select the in-memory representation optimized for area, e.g., the second set of nodes. Other optimization techniques may call for sharing hardware resources, such as Adders, Multipliers, etc., or reducing vector paths of the source model 118 to smaller vectors or scalars. If register usage exceeds a threshold, the optimization engine 204 may select a technique in which data is mapped to block RAMs rather than registers.

Similarly, if the constraint concerns power, the selector 232 may select an optimization technique that reduces power consumption. For example, a third in-memory representation of the given model element may be optimized for power consumption. The optimization technique may call for replacing nodes of the initial IR with a third in-memory representation, e.g., a third set of nodes, that, when implemented in hardware, use less power than the first and second in-memory representations of the given model element. For example, nodes representing a multiplier targeting a lookup table on an FPGA may be replaced with nodes representing dedicated multiplier hardware, which may consume less power than the lookup table implementation.

It should be understood that other optimization techniques may be available and/or selected. As noted, the optimization techniques may be designed for application to the initial IR 128.

The optimization engine 204 may thus automatically generate a revised initial IR that tries to optimize the identified bottleneck preventing the one or more constraints from being satisfied. The optimization performed by the optimization engine 204 may be saved. For example, the optimization engine 204 may save information regarding the selected optimization technique as well as the revised initial IR and/or the revised model. In an embodiment, the optimization engine 204 applies the optimization technique to the initial IR 128, which represents a high-level abstraction of the design, rather than to a low-level representation of the design, such as a Register Transfer Level (RTL) description.

Using the now revised initial IR, new HDL code may be generated, and the new HDL code may be passed to the synthesis tool chain 104, which may synthesize a target hardware element using the new HDL code, or it may generate a bitstream for use in synthesizing the target hardware element 108. Additionally, the performance analyzer 138 may generate one or more new synthesis reports that may be accessed by the code generation and optimization 200. The performance information mapper 230 may map the hardware-component performance information to the new final IR, through the new transitional IRs, and finally to the new initial IR. The optimization engine 204 may again determine whether the one or more constraints are now satisfied following the generation of new HDL code from the revised initial IR, and whether a termination criterion has been met. So long as the one or more constraints are not satisfied and the termination criterion is not met, the process may iterate through the loop.

If the optimization engine 204 determines that the one or more constraints, such as timing, area, and/or power constraints, are satisfied, then the automated optimization loop ends, and the report generator 208 may generate an optimization report. Processing may then be completed. If the one or more constraints are not satisfied, but the termination criterion has been met, then the automated optimization loop again ends, and an optimization report may be generated.

In an embodiment, the termination criterion may represent a methodology for proving that a better solution, e.g., in terms of timing, area, or power, than the current solution cannot be achieved. In other words, the termination criterion may relate to a best timing or best area solution. That is, the optimization engine 204 may proceed to optimize the source model 118 until a best timing or best area is achieved. If the critical path is found to be within a core element of the source model 118, the best timing criterion may be considered to be met. Exemplary methodologies include the use of greedy algorithms and hill climbing algorithms. The optimization engine 204 may apply a greedy or hill climbing algorithm during the iterative process to determine when the best solution has been reached.

In addition, the output of the optimization process may be a guidance file that describes the changes that should be made to the source model 118 to achieve the desired optimization. In particular, the report generator 208 may collect the changes made to the initial IR 128 to achieve the constraint, and may describe these changes in a user understandable form in the guidance file. For example, the changes may be described in terms of model editing instructions. The report generator 208 may then output the guidance file, e.g., to a display or a printer. A user may then examine the guidance file, and choose to implement the recommendations by making the suggested changes to the source model 118 manually. The user may decide to make some or all of the suggested changes to the source model 118, and/or to make other changes to the source model 118.

As described, in some embodiments, the code generator 200 obtains performance data, including the identity of the critical path or paths, from the synthesis tool chain 104, identifies a performance bottleneck in the design, selects an optimization technique, and applies the optimization technique to generate a revised design that maintains functional integrity with the original version of the source model 118. The code generator 200 may iterate through this process until the one or more specified performance constraints are satisfied or a termination criterion is met. The process, moreover, may be fully automated, e.g., it may be performed automatically by the code generator 200.

The process may be used to characterize the design space in terms of conflicting objectives regarding timing, area and power. That is, the process may be repeated for the same source model using different performance constraints, and the resulting optimized model designs and/or generated HDL code may be evaluated, e.g., by a user of the system 100.

Figure 3A:
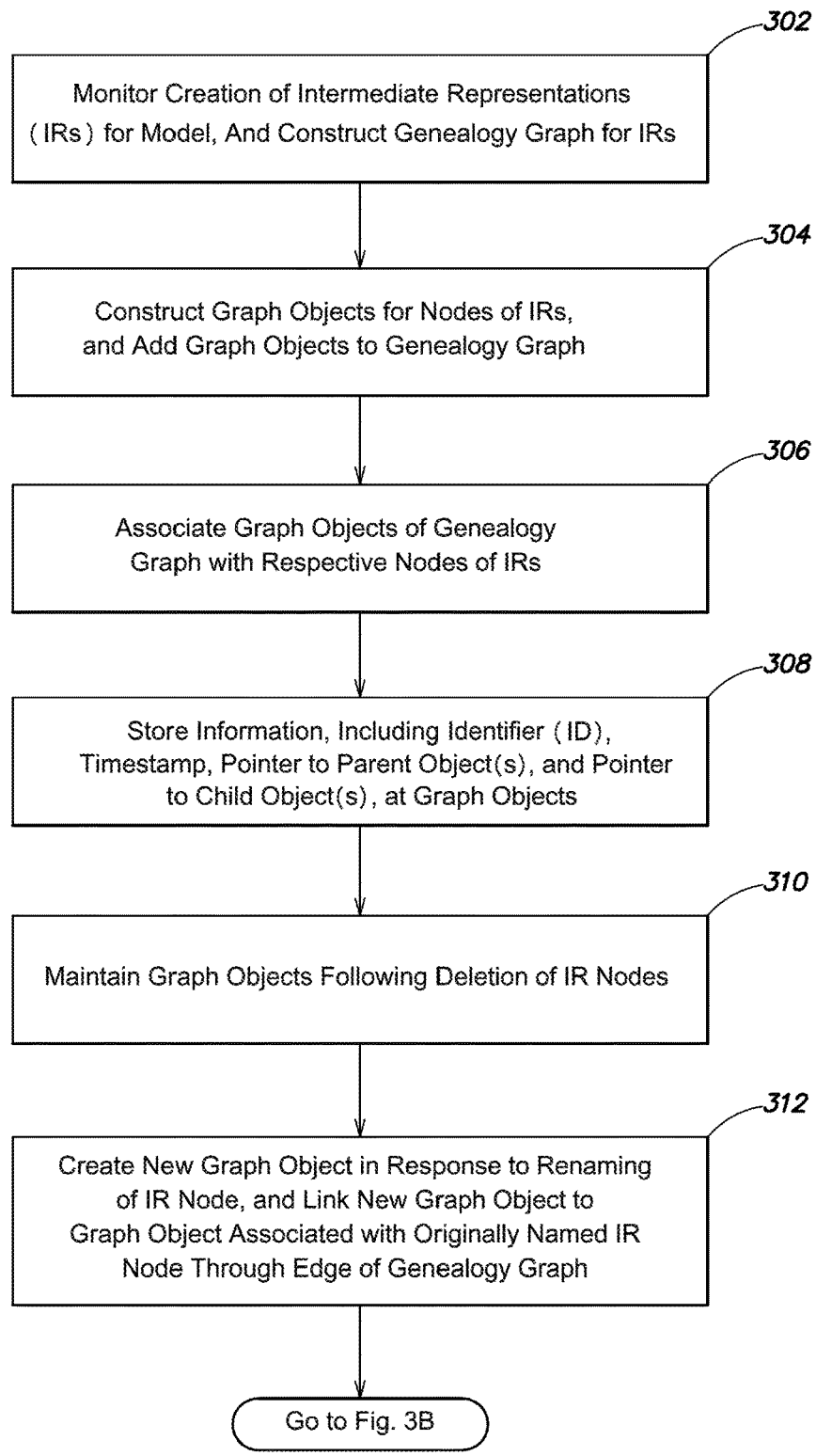
FIGS. 3A-C are partial views of a flow diagram of a method in accordance with an embodiment.
Figure 3B:
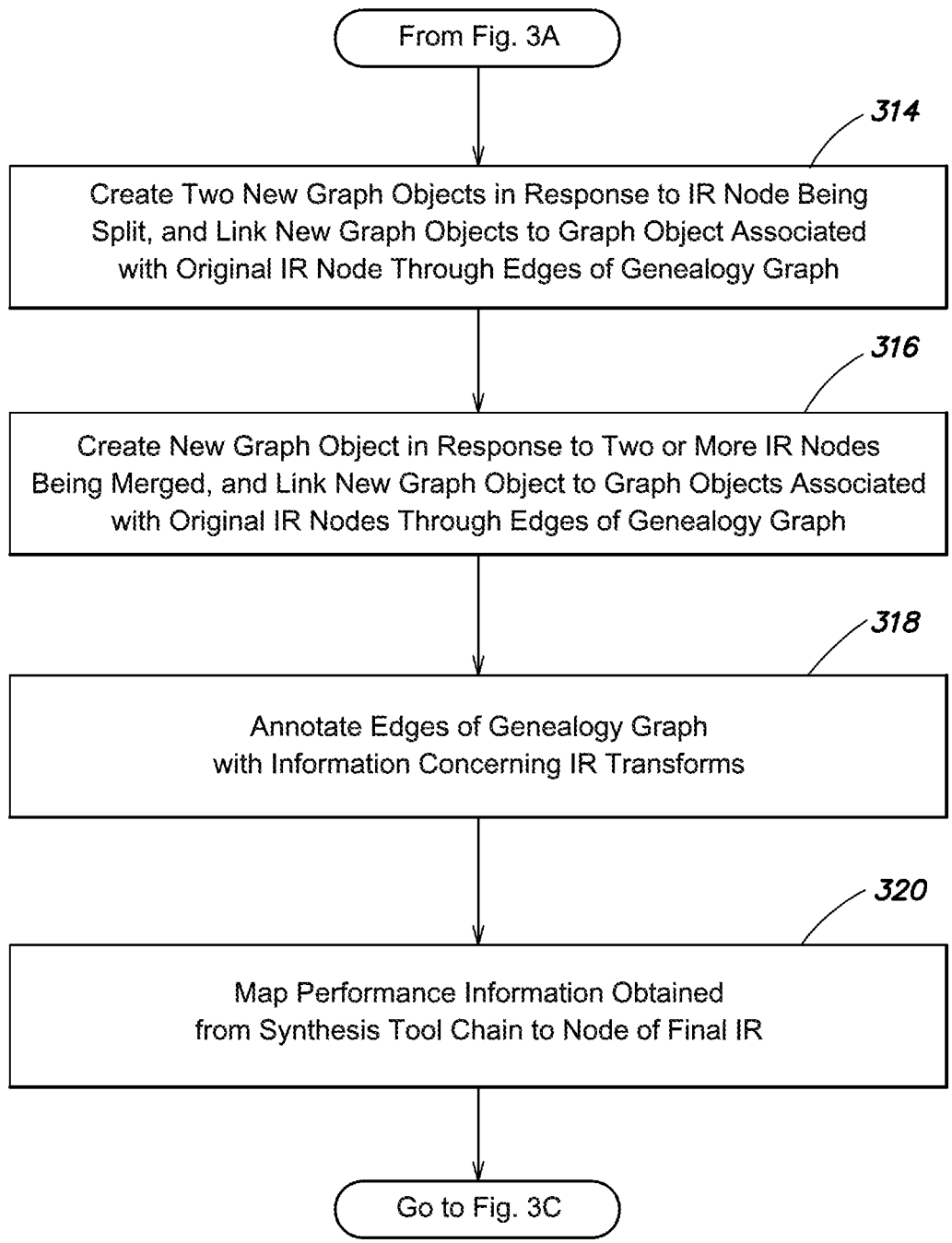
Figure 3C:
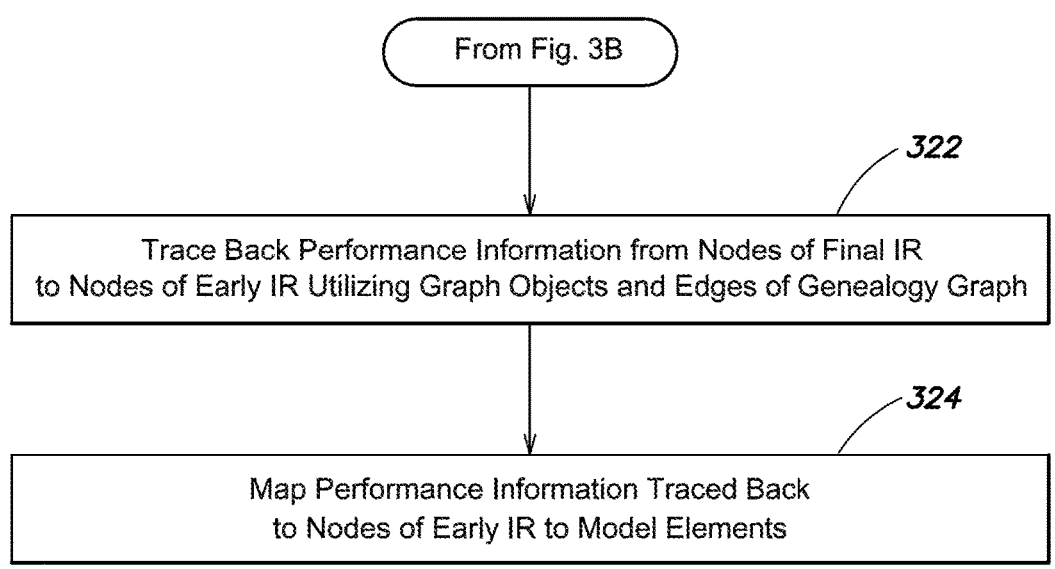

FIGS. 3A-C are partial views of a flow diagram of a method in accordance with an embodiment. The monitoring unit 234 of the graph builder 206 may monitor the creation of IRs during the code generation process, and may construct a genealogy graph for the IRs, as indicated at step 302. The graph builder 206 may construct graph objects for nodes of the IRs, and add the graph objects to the genealogy graph, as indicated at step 304. The graph builder 206 may associate the graph objects with the corresponding nodes of the IRs, as indicated at step 306. The graph builder 206 may store information at the graph objects, including an identifier (ID) of the graph object, a time of creation of the graph object, and pointers to parent and child objects, as indicated at step 308. The graph builder 206 may maintain graph objects in the genealogy graph even though the respective IR node is deleted, for example during an IR transform, as indicated at step 310. The graph builder 206 may create a new graph object in response to an IR node being renamed, and may link the new graph object to the graph object associated with the original IR node, as indicated at step 312.

The graph builder 206 may create two new graph objects in response to an IR node being split, and may link the new graph objects to the graph object associated with the original IR node, as indicated at step 314 (FIG. 3B). The graph builder 206 may create a new graph object in response to two or more IR nodes being merged, and may link the new graph object to the graph objects associated with the original IR nodes, as indicated at step 316. The graph builder 206 may annotate edges of the genealogy graph with information concerning IR transformations that result in the creation of new IR nodes in place of other IR nodes, as indicated at step 318.

The performance information mapper 230 may obtain performance information from the synthesis tool chain 104, and map that information to nodes of the final IR 226, as indicated at step 320. The performance information mapper 230 may trace back the performance information mapped to nodes of the final IR 226 to nodes of the initial IR 128, as indicated at step 322 (FIG. 3C). The performance information mapper 230 may trace back performance information from nodes of the initial IR 128 to model elements of a model, as indicated at step 324.

As described, in some embodiments, the graph builder 206 may utilize a genealogy graph to trace IR nodes (and thus information associated with IR nodes) in the direction from a final IR toward an initial IR. In some embodiments, the graph builder 206 may utilize a genealogy graph to trace IR nodes (and thus information associated with IR nodes) in the direction from an initial IR toward a final IR. In addition, the tracing of IR nodes may start at an IR other than an initial IR, and/or may end at an IR other than a final IR. For example, the tracing may start at an early IR (other than the initial IR), and end at late IR (other than the final IR). Suppose, for example, that a user is interested in determining when a particular node first appears in a set of IRs, such as a node relating to a delay block. The graph builder 206 may trace through a plurality of IRs in a direction toward an initial IR, and determine at which IR the subject node first appears. In this way, the graph builder 206 may identify the particular IR transform that resulted in the creation of the subject node. In addition, the optimization associated with the particular IR transform, which resulted in the creation of the subject node, may be identified utilizing the genealogy graph, and reported, e.g., to a user. If the result is deemed undesirable, a new compilation flow may then be initiated with the particular optimization turned off.

If the subject node is traced all the way back to the initial IR, then it may be determined that the subject node is a result of the model's structure, such as one of the elements included in the model. In this case, the model may be revised, for example by removing or replacing the model element.

Accordingly, a genealogy graph may be utilized for tracing information in either direction, and for tracing any information that may be associated with IR nodes, not just hardware performance information.

In some embodiments, there may be more than one group of transitional and final IRs that share the same initial IR. For example, a first group of transitional and final IRs may be generated for HDL code generation purposes. A second group of transitional and final IRs may be generated C code generation purposes. A third group of transitional and final IRs may be generated for report generation or model generation. Other groups of transitional and final IRs may be generated during compiler flow using different optimization or other settings. It should be understood that different transforms may be applied with respect to each group of IRs, and that the final IRs and at least some of the transitional IRs may be different among the groups.

Figure 13:
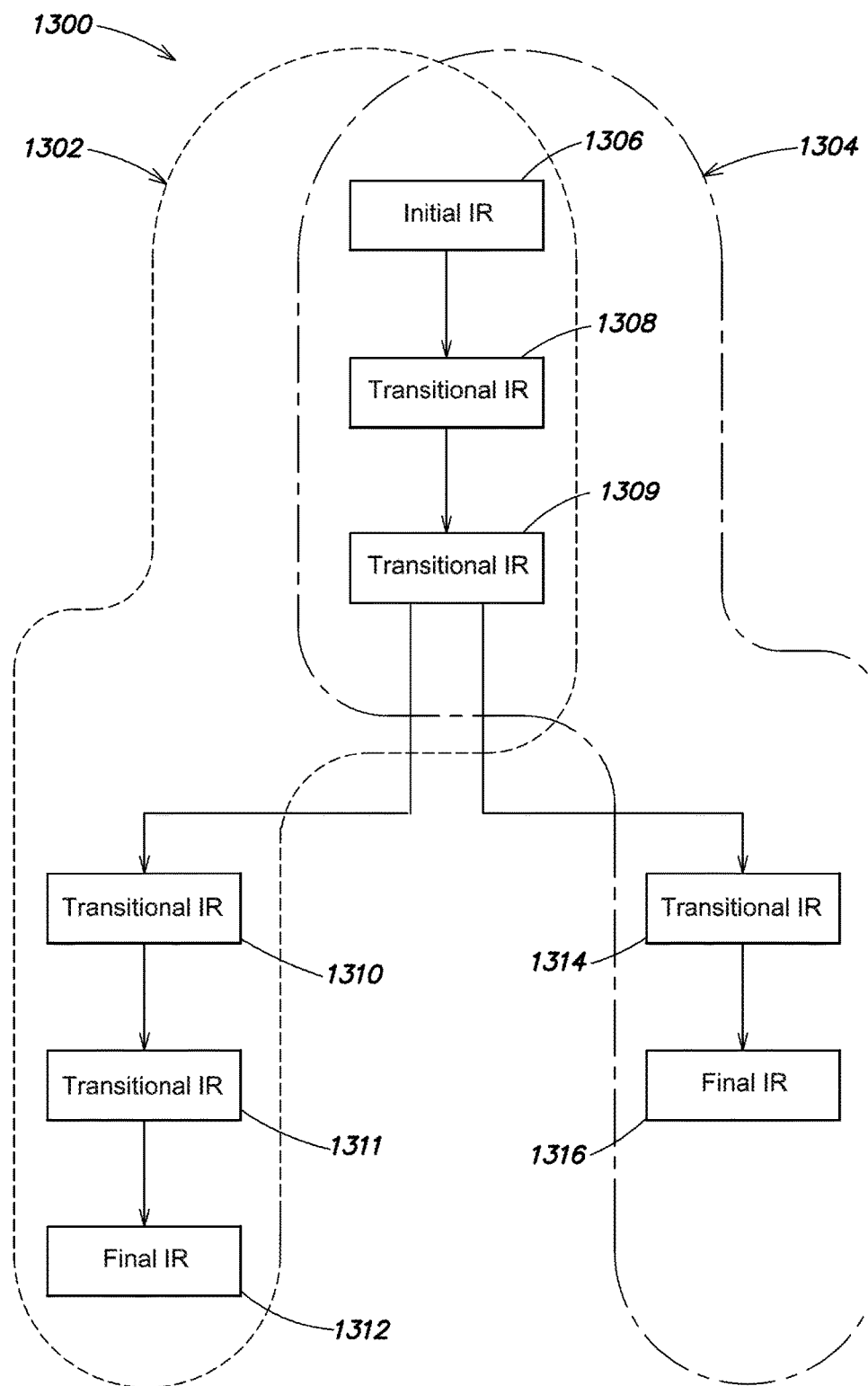
FIG. 13 is a schematic diagram of two groups of intermediate representations.

FIG. 13 is a schematic illustration of two groups of IRs 1300; a first group 1302 and a second group 1304. The first group 1302 includes an initial IR 1306, four transitional IRs 1308-1311, and a final IR 1312. The second group 1304 includes the same initial IR 1306, the same first two transitional IRs 1308 and 1309, a new transitional IR 1314, and a new final IR 1316. Arrows extending between the various IRs may represent transforms or other compiler operations. The final IR 1312 of the first group 1302 may be suitable for C code generation, while the final IR 1316 of the second group 1304 may be suitable for HDL generation. As shown, the two groups 1302 and 1304 share the initial IR 1306 and the first two transitional IRs 1308 and 1309, with the transitional IR 1309 being the last common IR between the two groups 1302 and 1304. For example, the same transforms or other operations may be applied until the transitional IR 1309 is produced. Thereafter, different transforms or operations are applied for C code generation and HDL generation resulting in the subsequent transitional IRs 1310, 1311, and 1314 and the final IRs 1312 and 1316 being different between the two groups 1302 and 1304.

The graph builder 206 may trace information between the first and second groups 1302 and 1304 of IRs. For example, the graph builder 206 may trace information from the final IR 1312 from the first group 1302 to the final IR 1316 from the second group 1304. In some embodiments, the graph builder 206 may trace back to the initial IR 1306. Then, the graph builder 206 may trace forward from the initial IR 1306 through the transitional IRs 1308, 1309, and 1314 of the second group 1304 until reaching the final IR 1316 of the second group 1304. If there is a common transitional IR between the two groups, then the graph builder 206 may only trace back to that common transitional IR before tracing forward to the final IR of the second group. For example, the graph builder may trace back from the final IR 1312 of the first group 1302 to the transitional IR 1309, which represents the latest transitional IR that is common between the groups 1302 and 1304. From this common transitional IR 1309, the graph builder 206 may then trace forward to the final IR 1316 of the second group 1304. In some embodiments, the graph builder 206 may trace back to a different common transitional IR, such as the transitional IR 1308.

The tracing between final IRs, such as the final IRs 1312 and 1316, may also be performed in connection with Hardware/Software codesign. The code generator 200 may start with the initial IR 1306 for a source model or component, generate one or more transitional IRs, such as the transitional IRs 1308 and 1309, and automatically partition the transitional IR 1309 into pieces. The code generator 200 may then apply different transforms or operations to these pieces to produce the different final IRs 1312 and 1316 from which software, e.g., C code, and hardware, e.g., HDL, may be generated. At the latest common transitional IR 1306, some IR nodes, which may correspond to the interfaces between the software and hardware targets, may be split, and thereafter may evolve separately. These IR nodes may identify interfaces. Utilizing the genealogy graph, the graph builder 206 may identify such IR nodes of the latest common transitional IR 1309, for example, by tracing back from the two final IRs 1312 and 1316. The report generator 208 may generate a report that identifies and describes such IR nodes. A user may evaluate such a report to discover the interfaces between the hardware and software components of the design. The user may inspect the interfaces, and may conduct debugging, verification, and validation operations.

A genealogy graph may thus be utilized for a variety of purposes.

Embedded System

Figure 11:
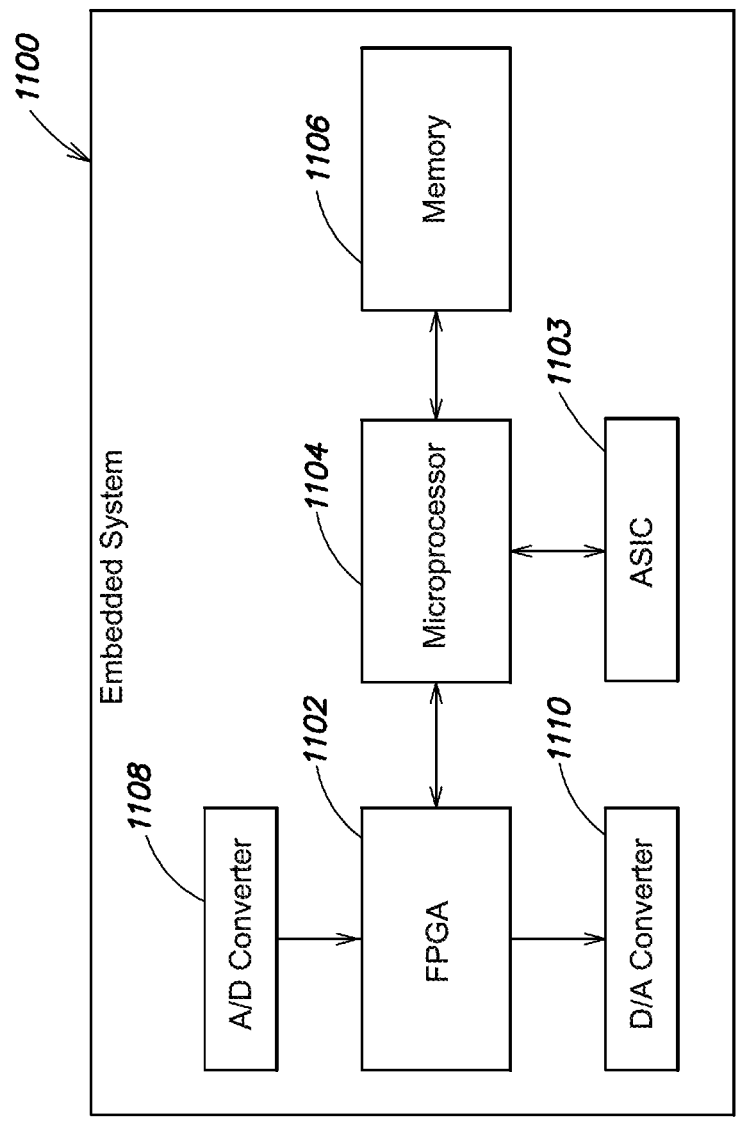
FIG. 11 is a schematic diagram of an embedded system in accordance with an embodiment.

FIG. 11 is a schematic illustration of an embedded system 1100. The embedded system 1100 may include one or more target hardware elements, such as an FPGA 1102 and an ASIC 1103. The embedded system 1100 also may include a microprocessor 1104, such as a Digital Signal Processor (DSP), and a memory 1106. The embedded system 1100 may also include one or more analog components, such as an Analog-to-Digital (A/D) converter 1108, and a Digital-to-Analog (D/A) converter 1110. The embedded system 1100 of FIG. 11 is intended for illustrative purposes only, and the present invention may be used with other embedded system designs. For example, the embedded system 1100 may include a general purpose processor in addition to or in place of the microprocessor 1104. In addition, the embedded system 1100 may include additional components, fewer components, or different components than those shown in FIG. 11. Moreover, the embedded system 1100 may include components arranged in configurations that differ from the configuration of FIG. 11.

An executable model, such as a graphical block diagram, may be created by a user that includes one or more first portions to be run on the FPGA 1102, one or more second portions to be run on the ASIC 1103, and one or more third portions to be run by the microprocessor 1104. For example, the user may partition the model and assign different partitions to different hardware components, such as the FPGA 1102 and the ASIC 1103.

The FPGA 1102 and the ASIC 1103 may be configured using the automated optimization process of the present invention. For example, the synthesis tool chain 104 may be used to configure the FPGA 1102 and the ASIC 1103 from final versions of generated HDL.

Illustrative Data Processing System

Figure 12:
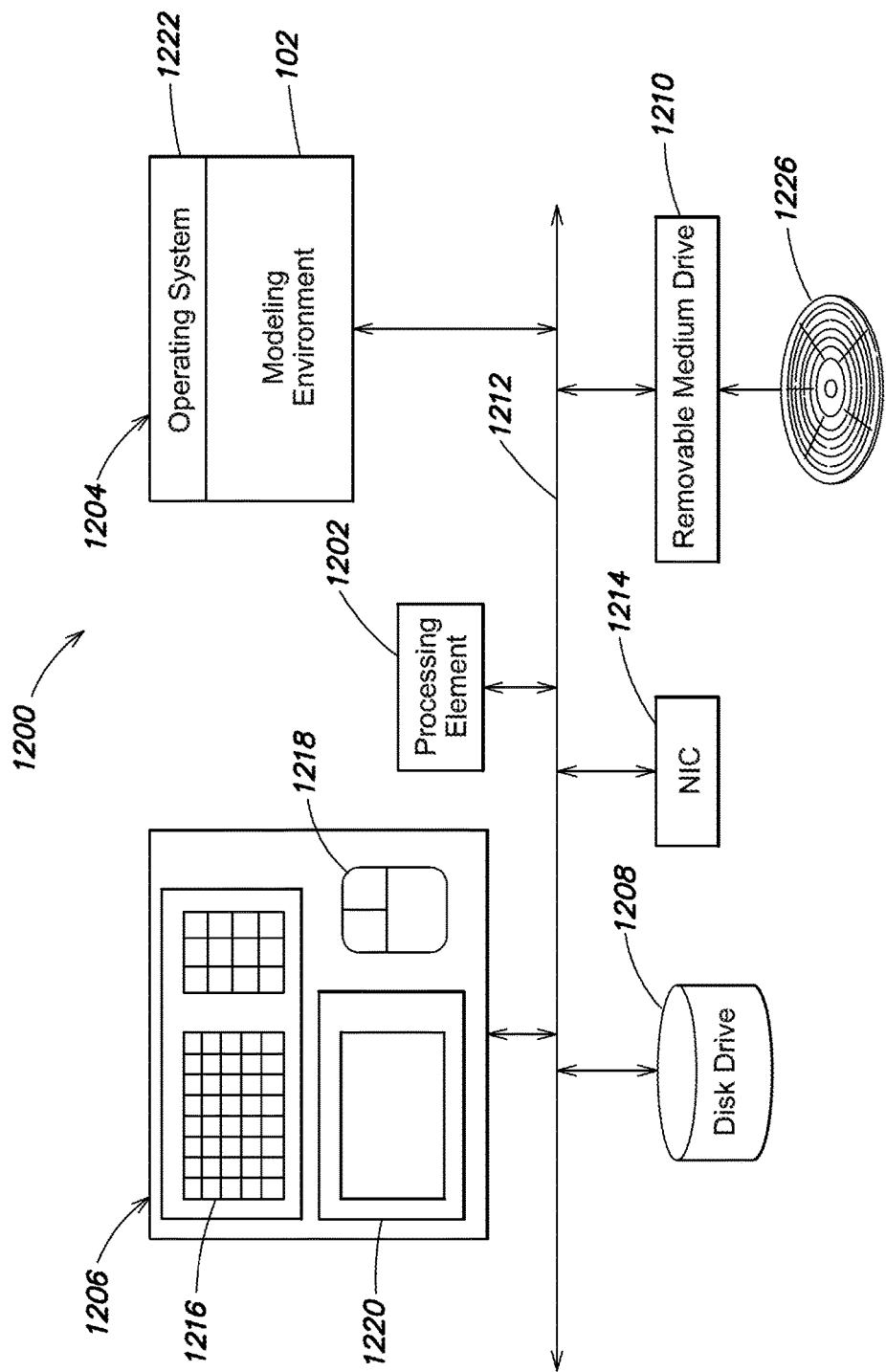
FIG. 12 is a schematic diagram of a data processing device in accordance with an embodiment.

FIG. 12 is a schematic illustration of a computer or data processing system 1200 for implementing an embodiment of the invention. The computer system 1200 may include one or more processing elements, such as a processor 1202, a main memory 1204, user input/output (I/O) 1206, a persistent data storage unit, such as a disk drive 1208, and a removable medium drive 1210 that are interconnected by a system bus 1212. The computer system 1200 may also include a communication unit, such as a network interface card (NIC) 1214. The user I/O 1206 may include a keyboard 1216, a pointing device, such as a mouse 1218, and a display 1220. Other user I/O 1206 components include voice or speech command systems, other pointing devices include touchpads and touchscreens, and other output devices besides a display, include a printer, a projector, a touchscreen, etc. Exemplary processing elements include single or multi-core Central Processing Units (CPUs), Graphics Processing Units (GPUs), Field Programmable Gate Arrays (FPGAs), Application Specific Integrated Circuits (ASICs), microprocessors, microcontrollers, etc.

The main memory 1204, which may be a Random Access Memory (RAM), may store a plurality of program libraries or modules, such as an operating system 1222, and one or more application programs that interface to the operating system 1222, such as the modeling environment 102.

The removable medium drive 1210 may accept and read a computer readable medium 1226, such as a CD, DVD, floppy disk, solid state drive, tape, flash memory or other non-transitory medium. The removable medium drive 1210 may also write to the computer readable medium 1226.

Suitable computer systems include personal computers (PCs), workstations, servers, laptops, tablets, palm computers, smart phones, electronic readers, and other portable computing devices, etc. Nonetheless, those skilled in the art will understand that the computer system 1200 of FIG. 12 is intended for illustrative purposes only, and that the present invention may be used with other computer systems, data processing systems, or computational devices. The present invention may also be used in a networked, e.g., client-server, computer architecture, or a public and/or private cloud computing arrangement. For example, the modeling environment application 102 may be hosted on a server, and accessed by a remote client through an application hosting system, such as the Remote Desktop Connection tool from Microsoft Corp.

Suitable operating systems 1222 include the Windows series of operating systems from Microsoft Corp. of Redmond, Wash., the Android and Chrome OS operating systems from Google Inc. of Mountain View, Calif., the Linux operating system, the MAC OS® series of operating systems from Apple Inc. of Cupertino, Calif., and the UNIX® series of operating systems, among others. The operating system 1222 may provide services or functions for other modules, such as allocating memory, organizing data according to a file system, prioritizing requests, etc. The operating system 1222 may run on a virtual machine, which may be provided by the data processing system 1200.

As indicated above, a user or developer, such as an engineer, scientist, programmer, etc., may utilize one or more input devices, such as the keyboard 1216, the mouse 1218, and the display 1220 to operate the modeling environment 102, and construct one or more models, such as graphical models having executable semantics. In particular, the model may provide one or more of time-based, event-based, state-based, frequency-based, control-flow based, and dataflow-based execution semantics. The execution of a model may simulate operation of the system that is being designed or evaluated. The term graphical model, moreover, is intended to include graphical program.

The foregoing description of embodiments is intended to provide illustration and description, but is not intended to be exhaustive or to limit the invention to the precise form disclosed. Modifications and variations are possible in light of the above teachings or may be acquired from a practice of the invention. For example, while a series of acts has been described above with respect to the flow diagrams, the order of the acts may be modified in other implementations. Further, non-dependent acts may be performed in parallel. Also, the term "user", as used herein, is intended to be broadly interpreted to include, for example, a computer or data processing system (e.g., system 1200) or a user of a computer or data processing system, unless otherwise stated.

Further, certain embodiments of the invention may be implemented as logic that performs one or more functions. This logic may be hardware-based, software-based, or a combination of hardware-based and software-based. Some or all of the logic may be stored in one or more tangible non-transitory computer-readable storage media and may include computer-executable instructions that may be executed by a computer or data processing system, such as system 100. The computer-executable instructions may include instructions that implement one or more embodiments of the invention. The tangible non-transitory computer-readable storage media may be volatile or non-volatile and may include, for example, flash memories, dynamic memories, removable disks, and non-removable disks.

No element, act, or instruction used herein should be construed as critical or essential to the invention unless explicitly described as such. Also, as used herein, the article "a" is intended to include one or more items. Where only one item is intended, the term "one" or similar language is used. Further, the phrase "based on" is intended to mean "based, at least in part, on" unless explicitly stated otherwise.

The foregoing description has been directed to specific embodiments of the present invention. It will be apparent, however, that other variations and modifications may be made to the described embodiments, with the attainment of some or all of their advantages. For example, in addition to or instead of executable graphical models, the invention may be used with graphical models having executable semantics, such as models created using Architecture Analysis and Design Language (AADL), Uniform Modeling Language (UML), and/or SysML tools. In addition, the generated code may include fixed-point code to run on a fixed-point processor, or code to emulate fixed-point behavior on a floating-point processor. Therefore, it is the object of the appended claims to cover all such variations and modifications as come within the true spirit and scope of the invention.

What is claimed is:

1. A method comprising:
  storing, in a memory, an executable model including a plurality of model elements;
  generating an initial intermediate representation (IR) of the executable model, the initial IR including a plurality of initial IR nodes corresponding to the plurality of model elements of the executable model;
  generating a plurality of transitional IRs and a final IR by applying a plurality of transforms to the initial IR and to selected ones of the plurality of transitional IRs, the plurality of transitional IRs including transitional IR nodes and the final IR including final IR nodes, the plurality of transforms including compiler operations;
  automatically building, by a processor coupled to the memory, a genealogy graph for the initial IR, the plurality of transitional IRs, and the final IR, where
  the genealogy graph includes a plurality of graph objects, the plurality of graph objects associated with respective ones of the initial IR nodes, the transitional IR nodes, and the final IR nodes,
  the genealogy graph records changes to one or more of the initial IR nodes or to one or more of the transitional IR nodes occurring over time from one or more of the plurality of transforms, and
  the plurality of graph objects are linked by edges that represent the plurality of transforms applied to the initial IR and to the selected ones of the plurality of transitional IRs, and tracing information associated with a first given IR node to a second given IR node utilizing the genealogy graph, wherein the first given IR node and the second given IR node are one of the plurality of initial IR nodes, the transitional IR nodes or the final IR nodes.

2. The method of claim 1 wherein a first transform of the plurality of transforms results in a deletion of a given transitional IR node, the method further comprising:
  retaining the graph object of the genealogy graph that is associated with the given transitional IR node that is deleted.

3. The method of claim 1 wherein the plurality of graph objects include data that identifies the plurality of initial IR nodes, the transitional IR nodes, and the final IR nodes to which the plurality of graph object are associated.

4. The method of claim 1 further comprising:
  annotating one or more of the edges of the genealogy graph with first information identifying respective ones of the plurality of transforms.

5. The method of claim 1 further comprising:
  receiving data;
  associating the data with the plurality of graph objects of the genealogy graph corresponding to the final IR nodes.

6. The method of claim 5 further comprising:
  tracing the data associated with the final IR nodes to the initial IR nodes, utilizing one or more of the edges of the genealogy graph.

7. The method of claim 6 further comprising:
  associating the data traced to the initial IR nodes with the plurality of model elements of the executable model.

8. The method of claim 7 wherein in the data associated with the final IR nodes is hardware performance data, the method further comprising:
  generating hardware performance information for the executable model, the hardware performance information based on the hardware performance data associated with the plurality of model elements of the executable model.

9. The method of claim 1 further comprising:
  generating a plurality of second transitional IRs and a second final IR by applying a plurality of second transforms to the initial IR and selected ones of the plurality of second transitional IRs, the plurality of second transitional IRs including second transitional IR nodes and the second final IR including second final IR nodes;
  updating the genealogy graph to include a plurality of second graph objects, the plurality of second graph objects associated with respective ones of the second transitional IR nodes and the second final IR nodes;
  associating data with the plurality of graph objects of the genealogy graph corresponding to the final IR nodes; and
  tracing the data associated with the plurality of graph objects corresponding to the final IR nodes to one or more of the second final IR nodes.

10. The method of claim 9 wherein the final IR has a structure suitable for generating code conforming to a first programming language, and the second final IR has a structure suitable for generating code conforming to a second programming language.

11. One or more non-transitory computer-readable media comprising programming instructions, the program instructions, when executed by a processor, instructing the processor to:
  store, in a memory coupled to the processor, an executable model including a plurality of model elements;
  generate a first intermediate representation (IR) of the executable model, the first IR including a plurality of first IR nodes associated with the plurality of model elements of the executable model;
  apply one or more transforms to the first IR to produce a second IR, the second IR including a plurality of second IR nodes, the one or more transforms including compiler operations;
  automatically build, by the processor, a genealogy graph for the executable model, where the genealogy graph includes
    a plurality of graph objects, the plurality of graph objects associated with respective ones of the plurality of first IR nodes and the plurality of second IR nodes, and
    pointers among the plurality of graph objects, the pointers linking the plurality of first IR nodes to the plurality of second IR nodes based on the one or more transforms applied to the first IR to produce the second IR, and the genealogy graph records changes to one or more of the plurality of first IR nodes or to one or more of the plurality of second IR nodes occurring over time from the one or more transforms;
associate information with a given second IR node of the plurality of second IR nodes; and
trace the information associated with the given second IR node to a given first IR node of the plurality of first IR nodes utilizing the genealogy graph.

12. The one or more computer-readable media of claim 11 wherein the program instructions further instruct the processor to:
annotate one or more of the pointers of the genealogy graph with first information identifying the one or more transforms.

13. The one or more computer-readable media of claim 11 wherein the pointers link the plurality of first IR nodes to the plurality of second IR nodes through a plurality of intermediate graph objects associated with IR nodes of transitional IRs.

14. The one or more computer-readable media of claim 13 wherein the first IR is an initial IR for the executable model, and the second IR is a final IR having a structure suitable for code generation.

15. The one or more computer-readable media of claim 11 wherein the program instructions further instruct the processor to:
trace the information from the given first IR node to one or more of the plurality of model elements of the executable model.

16. An apparatus comprising:
a memory storing an executable model, the executable model including a plurality of model elements; and
a processor coupled to the memory, the processor configured to:
generate a first intermediate representation (IR) of the executable model, the first IR including a plurality of first IR nodes associated with the plurality of model elements of the executable model;
apply one or more transforms to the first IR to produce a second IR, the second IR including a plurality of second IR nodes, the one or more transforms including compiler operations;
automatically build a genealogy graph for the executable model, where the genealogy graph includes
a plurality of graph objects, the plurality of graph objects associated with respective ones of the plurality of first IR nodes and the plurality of second IR nodes, and
pointers among the plurality of graph objects, the pointers linking the plurality of first IR nodes to the plurality of second IR nodes based on the one or more transforms applied to the first IR to produce the second IR, and the genealogy graph records changes to one or more of the plurality of first IR nodes or to one or more of the plurality of second IR nodes occurring over time from the one or more transforms;
associate information with a particular first IR node of the plurality of first IR nodes; and
trace the information associated with the particular first IR node to a particular second IR node of the plurality of second IR nodes utilizing the genealogy graph.

17. The apparatus of claim 16 wherein the one or more transforms deletes a given first IR node, the processor further configured to:
retain the graph object of the genealogy graph that is associated with the given first IR node that is deleted.

18. The apparatus of claim 16 wherein the processor is further configured to:
annotate one or more of the pointers of the genealogy graph with first information identifying the one or more transforms.

19. The apparatus of claim 16 wherein the pointers link the plurality of first IR nodes to the plurality of second IR nodes through a plurality of intermediate graph objects associated with IR nodes of transitional IRs.

20. The apparatus of claim 19 wherein the first IR is an initial IR for the executable model, and the second IR is a final IR having a structure suitable for code generation.

21. The method of claim 1 where the compiler operations include at least one of:
procedure in-lining;
a loop transformation,
a global optimization;
a local optimization,
a register allocation; or
a target-dependent optimization.

22. The one or more computer-readable media of claim 11 where the compiler operations include at least one of:
procedure in-lining;
a loop transformation,
a global optimization;
a local optimization,
a register allocation; or
a target-dependent optimization.

23. The apparatus of claim 16 where the compiler operations include at least one of:
procedure in-lining;
a loop transformation,
a global optimization;
a local optimization,
a register allocation; or
a target-dependent optimization.

* * * * *

UNITED STATES PATENT AND TRADEMARK OFFICE
CERTIFICATE OF CORRECTION

PATENT NO. : 10,261,760 B1  
APPLICATION NO. : 14/562356  
DATED : April 16, 2019  
INVENTOR(S) : Yongfeng Gu Page 1 of 1

It is certified that error appears in the above-identified patent and that said Letters Patent is hereby corrected as shown below:

On the Title Page

Item (71) Applicant:  
The Mathworks, Inc., Natick, MA (US)  
Should read:  
The MathWorks, Inc., Natick, MA (US)

Signed and Sealed this  
Fifth Day of January, 2021

Andrei Iancu  
*Director of the United States Patent and Trademark Office*